(12) United States Patent
Weingarten et al.

(10) Patent No.: US 8,607,128 B2
(45) Date of Patent: Dec. 10, 2013

(54) LOW POWER CHIEN-SEARCH BASED BCH/RS DECODING SYSTEM FOR FLASH MEMORY, MOBILE COMMUNICATIONS DEVICES AND OTHER APPLICATIONS

(75) Inventors: Hanan Weingarten, Herzelia (IL); Eli Sterin, Yoqneam (IL); Ofir Avraham Kanter, Yoqneam (IL); Michael Katz, Haifa (IL)

(73) Assignee: Densbits Technologies Ltd., Haifa (IL)

( * ) Notice: Subject to any disclaimer, the term of this patent is extended or adjusted under 35 U.S.C. 154(b) by 788 days.

(21) Appl. No.: 12/595,971

(22) PCT Filed: Sep. 17, 2008

(86) PCT No.: PCT/IL2008/001241
§ 371 (c)(1),
(2), (4) Date: Oct. 15, 2009

(87) PCT Pub. No.: WO2009/072105
PCT Pub. Date: Jun. 11, 2009

(65) Prior Publication Data
US 2010/0131831 A1 May 27, 2010

Related U.S. Application Data

(60) Provisional application No. 60/996,948, filed on Dec. 12, 2007, provisional application No. 61/071,487, filed on May 1, 2008, provisional application No. 61/071,468, filed on Apr. 30, 2008, provisional application No. 60/996,782, filed on Dec. 5, 2007, provisional application No. 61/064,853, filed on Mar. 31, 2008, provisional application No. 61/006,805, filed on Jan. 31, 2008, provisional application No. 61/071,465, filed on Apr. 30, 2008, provisional application No. 61/129,608, filed on Jul. 8, 2008.

(51) Int. Cl.
*H03M 13/00* (2006.01)

(52) U.S. Cl.
USPC .............................. 714/780; 714/758; 714/764

(58) Field of Classification Search
USPC .......................................... 714/758, 764, 763
See application file for complete search history.

(56) References Cited

U.S. PATENT DOCUMENTS

| | | |
|---|---|---|
| 4,463,375 A | 7/1984 | Macovski |
| 4,584,686 A | 4/1986 | Fritze |
| 4,589,084 A | 5/1986 | Fling et al. |

(Continued)

OTHER PUBLICATIONS

International Search Report and Written opinion for application No. PCT/IL2008/001241, dated Jan. 23, 2009.

(Continued)

*Primary Examiner* — Joshua P Lottich
*Assistant Examiner* — Jeison C Arcos
(74) *Attorney, Agent, or Firm* — Dentons US LLP

(57) ABSTRACT

A low power Chien searching method employing Chien search circuitry comprising at least two hardware components that compute at least two corresponding bits comprising a Chien search output, the method comprising activating only a subset of the hardware components thereby to compute only a subset of the bits of the Chien search output; and activating hardware components other than those in the subset of hardware components, to compute additional bits of the Chien search output other than the bits in the subset of bits, only if a criterion on the subset of the bits of the Chien search output is satisfied.

25 Claims, 15 Drawing Sheets

(56) References Cited

U.S. PATENT DOCUMENTS

| | | | |
|---|---|---|---|
| 4,866,716 A * | 9/1989 | Weng | 714/782 |
| 5,077,737 A | 12/1991 | Leger et al. | |
| 5,297,153 A * | 3/1994 | Baggen et al. | 714/782 |
| 5,657,332 A | 8/1997 | Auclair et al. | |
| 5,729,490 A | 3/1998 | Calligaro et al. | |
| 5,793,774 A | 8/1998 | Usui et al. | |
| 5,926,409 A | 7/1999 | Engh et al. | |
| 5,956,268 A | 9/1999 | Lee | |
| 5,968,198 A * | 10/1999 | Hassan et al. | 714/752 |
| 5,982,659 A | 11/1999 | Irrinki et al. | |
| 6,038,634 A | 3/2000 | Ji et al. | |
| 6,094,465 A | 7/2000 | Stein et al. | |
| 6,119,245 A | 9/2000 | Hiratsuka | |
| 6,182,261 B1 | 1/2001 | Haller et al. | |
| 6,192,497 B1 * | 2/2001 | Yang et al. | 714/781 |
| 6,195,287 B1 | 2/2001 | Hirano | |
| 6,199,188 B1 | 3/2001 | Shen et al. | |
| 6,209,114 B1 | 3/2001 | Wolf et al. | |
| 6,259,627 B1 | 7/2001 | Wong | |
| 6,278,633 B1 | 8/2001 | Wong et al. | |
| 6,279,133 B1 | 8/2001 | Vafai et al. | |
| 6,301,151 B1 | 10/2001 | Engh et al. | |
| 6,370,061 B1 | 4/2002 | Yachareni et al. | |
| 6,374,383 B1 * | 4/2002 | Weng | 714/781 |
| 6,504,891 B1 | 1/2003 | Chevallier | |
| 6,532,169 B1 | 3/2003 | Mann et al. | |
| 6,532,556 B1 | 3/2003 | Wong et al. | |
| 6,553,533 B2 | 4/2003 | Demura et al. | |
| 6,560,747 B1 * | 5/2003 | Weng | 714/781 |
| 6,637,002 B1 * | 10/2003 | Weng et al. | 714/781 |
| 6,639,865 B2 * | 10/2003 | Kwon | 365/230.03 |
| 6,674,665 B1 | 1/2004 | Mann et al. | |
| 6,704,902 B1 * | 3/2004 | Shinbashi et al. | 714/785 |
| 6,751,766 B2 | 6/2004 | Guterman et al. | |
| 6,772,274 B1 | 8/2004 | Estakhri | |
| 6,781,910 B2 | 8/2004 | Smith | |
| 6,792,569 B2 * | 9/2004 | Cox et al. | 714/781 |
| 6,873,543 B2 | 3/2005 | Smith et al. | |
| 6,891,768 B2 | 5/2005 | Smith et al. | |
| 6,914,809 B2 | 7/2005 | Hilton et al. | |
| 6,915,477 B2 | 7/2005 | Gollamudi et al. | |
| 6,952,365 B2 | 10/2005 | Gonzalez et al. | |
| 6,961,890 B2 | 11/2005 | Smith | |
| 6,990,012 B2 | 1/2006 | Smith et al. | |
| 6,996,004 B1 | 2/2006 | Fastow et al. | |
| 6,999,854 B2 | 2/2006 | Roth | |
| 7,010,739 B1 * | 3/2006 | Feng et al. | 714/784 |
| 7,012,835 B2 | 3/2006 | Gonzalez et al. | |
| 7,038,950 B1 | 5/2006 | Hamilton et al. | |
| 7,068,539 B2 | 6/2006 | Guterman et al. | |
| 7,079,436 B2 | 7/2006 | Perner et al. | |
| 7,149,950 B2 | 12/2006 | Spencer et al. | |
| 7,177,977 B2 | 2/2007 | Chen et al. | |
| 7,191,379 B2 | 3/2007 | Adelmann et al. | |
| 7,196,946 B2 | 3/2007 | Chen et al. | |
| 7,203,874 B2 | 4/2007 | Roohparvar | |
| 7,290,203 B2 | 10/2007 | Emma et al. | |
| 7,292,365 B2 | 11/2007 | Knox | |
| 7,301,928 B2 | 11/2007 | Nakabayashi et al. | |
| 7,441,067 B2 | 10/2008 | Gorobets et al. | |
| 7,466,575 B2 | 12/2008 | Shalvi et al. | |
| 7,533,328 B2 | 5/2009 | Alrod et al. | |
| 7,558,109 B2 | 7/2009 | Brandman et al. | |
| 7,593,263 B2 | 9/2009 | Sokolov et al. | |
| 7,697,326 B2 | 4/2010 | Sommer et al. | |
| 7,706,182 B2 | 4/2010 | Shalvi et al. | |
| 7,804,718 B2 | 9/2010 | Kim | |
| 7,805,663 B2 | 9/2010 | Brandman et al. | |
| 7,805,664 B1 | 9/2010 | Yang et al. | |
| 7,844,877 B2 | 11/2010 | Litsyn et al. | |
| 7,961,797 B1 | 6/2011 | Yang et al. | |
| 8,020,073 B2 | 9/2011 | Emma et al. | |
| 8,122,328 B2 | 2/2012 | Liu et al. | |
| 2002/0063774 A1 | 5/2002 | Hillis et al. | |
| 2002/0085419 A1 | 7/2002 | Kwon et al. | |
| 2002/0154769 A1 | 10/2002 | Petersen et al. | |
| 2003/0065876 A1 | 4/2003 | Lasser | |
| 2003/0101404 A1 | 5/2003 | Zhao et al. | |
| 2003/0105620 A1 | 6/2003 | Bowen | |
| 2003/0192007 A1 | 10/2003 | Miller et al. | |
| 2004/0015771 A1 | 1/2004 | Lasser et al. | |
| 2004/0030971 A1 | 2/2004 | Tanaka et al. | |
| 2004/0153722 A1 | 8/2004 | Lee | |
| 2004/0153817 A1 | 8/2004 | Norman et al. | |
| 2004/0181735 A1 | 9/2004 | Xin | |
| 2005/0013165 A1 | 1/2005 | Ban | |
| 2005/0018482 A1 | 1/2005 | Cemea et al. | |
| 2005/0083735 A1 | 4/2005 | Chen et al. | |
| 2005/0117401 A1 | 6/2005 | Chen et al. | |
| 2005/0120265 A1 | 6/2005 | Pline et al. | |
| 2005/0128811 A1 | 6/2005 | Kato et al. | |
| 2005/0138533 A1 | 6/2005 | Le Bars et al. | |
| 2005/0144213 A1 | 6/2005 | Simkins et al. | |
| 2005/0144368 A1 | 6/2005 | Chung et al. | |
| 2005/0169057 A1 | 8/2005 | Shibata et al. | |
| 2005/0172179 A1 | 8/2005 | Brandenberger et al. | |
| 2005/0213393 A1 | 9/2005 | Lasser | |
| 2006/0059406 A1 | 3/2006 | Micheloni et al. | |
| 2006/0059409 A1 | 3/2006 | Lee | |
| 2006/0064537 A1 | 3/2006 | Oshima | |
| 2006/0101193 A1 | 5/2006 | Murin | |
| 2006/0203587 A1 | 9/2006 | Li et al. | |
| 2006/0221692 A1 | 10/2006 | Chen | |
| 2006/0248434 A1 | 11/2006 | Radke et al. | |
| 2006/0268608 A1 | 11/2006 | Noguchi et al. | |
| 2006/0294312 A1 | 12/2006 | Walmsley | |
| 2007/0025157 A1 | 2/2007 | Wan et al. | |
| 2007/0063180 A1 | 3/2007 | Asano et al. | |
| 2007/0103992 A1 | 5/2007 | Sakui et al. | |
| 2007/0104004 A1 | 5/2007 | So et al. | |
| 2007/0109858 A1 | 5/2007 | Conley et al. | |
| 2007/0124652 A1 | 5/2007 | Litsyn et al. | |
| 2007/0143561 A1 | 6/2007 | Gorobets | |
| 2007/0150694 A1 | 6/2007 | Chang et al. | |
| 2007/0168625 A1 | 7/2007 | Cornwell et al. | |
| 2007/0171714 A1 | 7/2007 | Wu et al. | |
| 2007/0171730 A1 | 7/2007 | Ramamoorthy et al. | |
| 2007/0180346 A1 | 8/2007 | Murin | |
| 2007/0223277 A1 | 9/2007 | Tanaka et al. | |
| 2007/0226582 A1 | 9/2007 | Tang et al. | |
| 2007/0226592 A1 | 9/2007 | Radke | |
| 2007/0228449 A1 | 10/2007 | Takano et al. | |
| 2007/0253249 A1 | 11/2007 | Kang et al. | |
| 2007/0253250 A1 | 11/2007 | Shibata et al. | |
| 2007/0263439 A1 | 11/2007 | Cornwell et al. | |
| 2007/0266291 A1 | 11/2007 | Toda et al. | |
| 2007/0271494 A1 | 11/2007 | Gorobets | |
| 2008/0010581 A1 | 1/2008 | Alrod et al. | |
| 2008/0028014 A1 | 1/2008 | Hilt et al. | |
| 2008/0055989 A1 | 3/2008 | Lee et al. | |
| 2008/0082897 A1 | 4/2008 | Brandman et al. | |
| 2008/0092026 A1 | 4/2008 | Brandman et al. | |
| 2008/0104309 A1 | 5/2008 | Cheon et al. | |
| 2008/0116509 A1 | 5/2008 | Harari et al. | |
| 2008/0126686 A1 | 5/2008 | Sokolov et al. | |
| 2008/0127104 A1 | 5/2008 | Li et al. | |
| 2008/0128790 A1 | 6/2008 | Jung | |
| 2008/0130341 A1 | 6/2008 | Shalvi et al. | |
| 2008/0137413 A1 | 6/2008 | Kong et al. | |
| 2008/0148115 A1 | 6/2008 | Sokolov et al. | |
| 2008/0158958 A1 | 7/2008 | Shalvi et al. | |
| 2008/0159059 A1 | 7/2008 | Moyer | |
| 2008/0162079 A1 | 7/2008 | Astigarraga et al. | |
| 2008/0168216 A1 | 7/2008 | Lee | |
| 2008/0168320 A1 | 7/2008 | Cassuto et al. | |
| 2008/0181001 A1 | 7/2008 | Shalvi | |
| 2008/0198650 A1 | 8/2008 | Shalvi et al. | |
| 2008/0198652 A1 | 8/2008 | Shalvi et al. | |
| 2008/0219050 A1 | 9/2008 | Shalvi et al. | |
| 2008/0225599 A1 | 9/2008 | Chae | |

(56) References Cited

U.S. PATENT DOCUMENTS

| | | |
|---|---|---|
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1* | 4/2009 | Chen et al. ............ 714/782 |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1* | 3/2010 | Weingarten et al. ........ 714/773 |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/118720 A3.
Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Kcshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Serge! Sawitzki, High-Throughput and Low Power Architectures for Reed Solomon Decoder, (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash Eeprom Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publisher, 1999.
Jedec Standard, "Stress-Test-Driven Qualification of Integrated Circuits", JEDEC SOlid State Technology Association. JEDEC Standard No. 47F pp. 1-26.

(56) References Cited

OTHER PUBLICATIONS

Dempster, et al., "Maximum Likelihood from Incomplete Data via the EM Algorithm", Journal of the Royal Statistical Society. Series B (Methodological), vol. 39, No. 1 (1997), pp. 1-38.

Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.

Daneshbeh, "Bit Serial Systolic Architectures for Multiplicative Inversion and Division over GF (2)", a thesis presented to the University of Waterloo, Ontario, Canada, 2005, pp. 1-118.

Chen, "Formulas for the solutions of Quadratic Equations over GF (2)", IEEE Trans. Inform. Theory, vol. IT-28, No. 5, Sep. 1982, pp. 792-794.

Berlekamp et al., "On the Solution of Algebraic Equations over Finite Fields", Inform. Cont. 10, Oct. 1967, pp. 553-564.

* cited by examiner

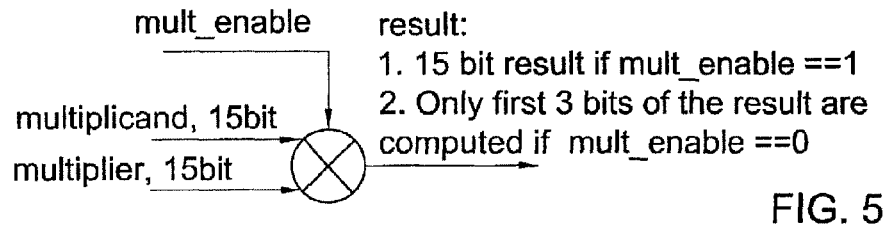

multiplicand, 15bit
multiplier, 15bit
mult_enable result:
1. 15 bit result if mult_enable ==1
2. Only first 3 bits of the result are computed if mult_enable ==0

FIG. 5B

| Parameter | Description |
|---|---|
| $P_{reg}$ | Power drawn by the register of each tap. |
| $P_{mult}$ | Power drawn by a full precision multiplier (all m sub-elements) |
| $P_{comb}$ | Power drawn by the combinatorial logic. |
| $1/q^c$ | In 1 out of every $q^c$ cycles on average the polynomial evaluation of c sub-elements equals to 1 even though the evaluation of all sub-elements of the polynomial might not be 1, involving recomputation of all sub-elements |

FIG. 6

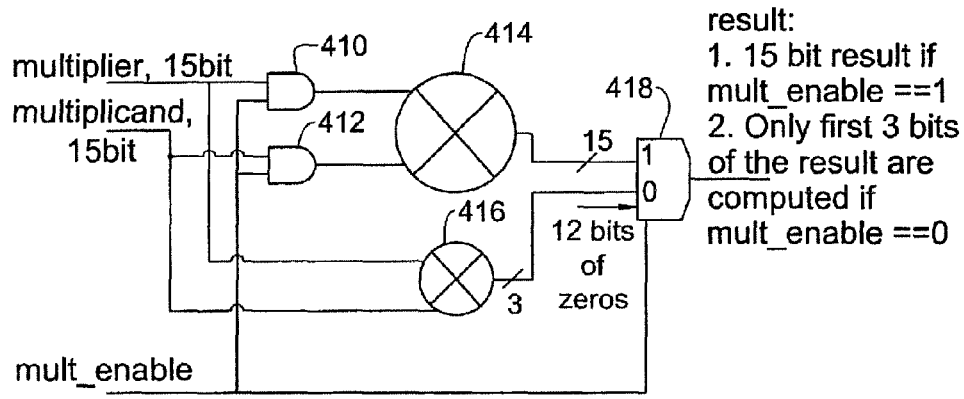

result:
1. 15 bit result if mult_enable ==1
2. Only first 3 bits of the result are computed if mult_enable ==0

FIG. 7A

LOW POWER CHIEN-SEARCH BASED BCH/RS DECODING SYSTEM FOR FLASH MEMORY, MOBILE COMMUNICATIONS DEVICES AND OTHER APPLICATIONS

CROSS REFERENCE TO RELATED APPLICATIONS

This application is a National Phase Application of PCT International Application No. PCT/IL2008/001241, entitled "A LOW POWER CHIEN-SEARCH BASED BCH/RS DECODING SYSTEM FOR FLASH MEMORY, MOBILE COMMUNICATIONS DEVICES AND OTHER APPLICATIONS" International Filing Date Sep. 17, 2008, publishes on Jun. 11, 2009 as International Publication No. WO 2009/072105, which in turn claims priority from U.S. Provisional Application No. 60/996,948, filed Dec. 12, 2007, U.S. Provisional Application No. 61/071,487, filed May 1, 2008, U.S. Provisional Application No. 61/071,468, filed Apr. 30, 2008, U.S. Provisional Application No. 60/996,782, filed Dec. 5, 2007, U.S. Provisional Application No. 61/064,853, filed Mar. 31, 2008, U.S. Provisional Application No. 61/006,805, filed Jan. 31, 2008, U.S. Provisional Application No. 61/071,465, filed Apr. 30, 2008 and U.S. Provisional Application No. 61/129,608, filed Jul. 8, 2008, all of which are incorporated herein by reference in their entirety.

Other co-pending applications include: U.S. Provisional Application No. 60/960,207, filed Sep. 20, 2007 and entitled "Systems and Methods for Coupling Detection in Flash Memory", U.S. Provisional Application No. 61/071,467, filed Apr. 30, 2008 and entitled "Improved Systems and Methods for Determining Logical Values of Coupled Flash Memory Cells", U.S. Provisional Application No. 60/960,943, filed Oct. 22, 2007 and entitled "Systems and methods to reduce errors in Solid State Disks and Large Flash Devices" and U.S. Provisional Application No. 61/071,469, filed Apr. 30, 2008 and entitled "Systems and Methods for Averaging Error Rates in Non-Volatile Devices and Storage Systems", U.S. Provisional Application No. 60/996,027, filed Oct. 25, 2007 and entitled "Systems and Methods for Coping with Variable Bit Error Rates in Flash Devices", U.S. Provisional Application No. 61/071,466, filed Apr. 30, 2008 and entitled "Systems and Methods for Multiple Coding Rates in Flash Devices", U.S. Provisional Application No. 61/006,120, filed Dec. 19, 2007 and entitled "Systems and Methods for Coping with Multi Stage Decoding in Flash Devices", U.S. Provisional Application No. 61/071,464, filed Apr. 30, 2008 and entitled "A Decoder Operative to Effect A Plurality of Decoding Stages Upon Flash Memory Data and Methods Useful in Conjunction Therewith", US Provisional Application No. 61/006,385, filed Jan. 10, 2008 and entitled "A System for Error Correction Encoder and Decoder Using the Lee Metric and Adapted to Work on Multi-Level Physical Media", U.S. Provisional Application No. 61/064,995, filed Apr. 8, 2008 and entitled "Systems and Methods for Error Correction and Decoding on Multi-Level Physical Media", U.S. Provisional Application No. 61/006,806, filed Jan. 31, 2008 and entitled "Systems and Methods for using a Erasure Coding in Flash memory", U.S. Provisional Application No. 61/071,486, filed May 1, 2008 and entitled "Systems and Methods for Handling Immediate Data Errors in Flash Memory", U.S. Provisional Application No. 61/006,078, filed Dec. 18, 2007 and entitled "Systems and Methods for Multi Rate Coding in Multi Level Flash Devices", U.S. Provisional Application No. 61/064,923, filed Apr. 30, 2008 and entitled "Apparatus For Coding At A Plurality Of Rates In Multi-Level Flash Memory Systems, And Methods Useful In Conjunction Therewith", U.S. Provisional Application No. 61/064,760, filed Mar. 25, 2008 and entitled "Hardware efficient implementation of rounding in fixed-point arithmetic", U.S. Provisional Application No. 61/071,404, filed Apr. 28, 2008 and entitled "Apparatus and Methods for Hardware-Efficient Unbiased Rounding", U.S. Provisional Application No. 61/136,234, filed Aug. 20, 2008 and entitled "A Method Of Reprogramming A Non-Volatile Memory Device Without Performing An Erase Operation", U.S. Provisional Application No. 61/129,414, filed Jun. 25, 2008 and entitled "Improved Programming Speed in Flash Devices Using Adaptive Programming", and several other co-pending patent applications being filed concurrently (same day).

FIELD OF THE INVENTION

The present invention relates generally to low power error correction systems and more particularly to Chien search apparatus.

BACKGROUND OF THE INVENTION

The term "Chien search" is used herein to refer to any typically recursive method or apparatus for determining roots of polynomials defined over a finite field. The term is also used herein to refer to any method or apparatus used for finding the roots of error-locator polynomials encountered in decoding, e.g. Reed-Solomon Odes and BCH codes in various applications such as but not limited to flash memory and other data storage applications, and data communications applications.

According to Wikipedia, in conventional Chien searches:

"We denote the polynomial (over the finite field GF(q)) whose roots we wish to determine as (formula I): $\Lambda(x) = \lambda_0 + \lambda_1 x + \lambda_2 x^2 + \ldots + \lambda_t x^t$ Conceptually, we may evaluate $\Lambda(\beta)$ for each non-zero in GF(q). Those resulting in 0 are roots of the polynomial.

The Chien search is based on two observations:

Each non-zero $\beta$ may be expressed as $\alpha^{i_\beta}$ for some $i_\beta$, where $\alpha$ is the primitive element of GF(q). Therefore, the powers $\alpha^i$ for $0 \le i \le (N-1)$ cover the entire field (excluding the zero element).

The following relationship exists (formula II):

$$\Lambda(\alpha^i) = \lambda_0 + \lambda_1(\alpha^i) + \lambda_2(\alpha^i)^2 + \ldots + \lambda_t(\alpha^i)^t$$
$$\stackrel{\Delta}{=} \gamma_{0,i} + \gamma_{1,i} + \gamma_{2,i} + \ldots + \gamma_{t,i}$$

$$\Lambda(\alpha^{i+1}) = \lambda_0 + \lambda_1(\alpha^{i+1}) + \lambda_2(\alpha^{i+1})^2 + \ldots + \lambda_t(\alpha^{i+1})^t$$
$$= \lambda_0 + \lambda_1(\alpha^i)\alpha + \lambda_2(\alpha^i)^2\alpha^2 + \ldots + \lambda_t(\alpha^i)^t\alpha^t$$
$$= \gamma_{0,i} + \gamma_{1,i}\alpha + \gamma_{2,i}\alpha^2 + \ldots + \gamma_{t,i}\alpha^t$$
$$\stackrel{\Delta}{=} \gamma_{0,i+1} + \gamma_{1,i+1} + \gamma_{2,i+1} + \ldots + \gamma_{t,i+1}$$

$$\gamma_{j,i+1} = \gamma_{j,i}\alpha^j$$

In this way, we may start at $i=0$ with $\gamma_{j,0} = \lambda_j$, and iterate through each value of i up to (N−1). If at any stage the resultant summation is zero, i.e.

$$\sum_{j=0}^{t} \gamma_{j,i} = 0,$$

then $\Lambda(\alpha^i)=0$ also, so $\alpha_i$ is a root. In this way, we check every element in the field.

When implemented in hardware, this approach significantly reduces the complexity, as all multiplications consist of one variable and one constant, rather than two variables as in the brute-force approach."

A Chien search therefore may comprise the following steps:

a. Receive a polynomial, $\Lambda(x)=\lambda_0+\lambda_1 x+\lambda_2 x^2+ \ldots +\lambda_t x^t$ defined over the finite field GF(q)) whose roots are to be determined, where the roots are the set of non-zero $\beta$ in GF(q), for which $\Lambda(\beta)=0$ Repeat the following steps b-d for all non-zero $\beta$ in GF(q)

b. Express $\beta$ as $\alpha^{i_\beta}$ for some $i_\beta$, where $\alpha$ a is the primitive element of GF(q).

c. Define each $\Lambda(\alpha^i)$ as the sum of a set of terms $\{\gamma_{j,i}|0\leq j\leq t\}$ d. Start at i=0 with $\gamma_{j,0}=\lambda_j$, and iterate through each value of i up to i=(N−1) where the iteration comprises deriving successive sets of terms using (formulae III):

$$\gamma_{j,i+1}=\gamma_{j,i}\alpha^i$$

However, if at any stage the resultant summation is zero, i.e.

$$\sum_{j=0}^{t}\gamma_{j,i}=0,$$

stop and output that $\alpha_i$ is a root.

Generally, any alpha^i for which the above error locator polynomial is zero, is termed a root. The above polynomial is encountered when decoding error correction code using Reed-Solomon code or BCH code. The alpha's are all primitive elements in a finite field over which the above polynomial is defined. The index of the power of the root indicates locations of errors. In BCH, each error is a flipped bit. In Reed-Solomon, each error is a symbol in which at least one bit is wrong. In other words, if $\alpha^n$ is a root of the Error Locator Polynomial (ELP) then if binary BCH code is being used, an error has occurred in bit n of the data being read or received. If non-binary BCH code, or RS code, is used, the fact that $\alpha^n$ is a root of the Error Locator Polynomial (ELP) implies that an error has occurred in symbol n of the received or read data.

The state of the art is believed to be represented by the following prior art documents inter alia:

a. U.S. Pat. Nos. 6,954,892; 6,990,624; 7,113,968; Published US Application 2007245220.

b. *Error Correction Coding Mathematical Methods and Algorithms*, Todd K. Moon, A JOHN WILEY & SONS, INC., 2005.

c. *Introduction to Coding Theory*, Ron M. Roth, Cambridge University Press, 2006.

d. *Algebraic Codes for Data Transmission*, Richard E. Blahut, Cambridge University Press, 2003.

e. *Introduction to Error Correcting Codes*, Michael Purser, Artech House Inc, 1995.

f. "High throughput and low-power architectures for Reed Solomon Decoder", by Akash Kumar (a.kumar at tue.nl, Eindhoven University of Technology) and Sergei Sawitzki (Sergei.sawitzki at philips.com).

g. "Low power decoding of BCH codes", by Yuejian Wu, Nortel Networks, Ottawa, Ont., Canada, in Circuits and Systems, 2004. ISCAS '04. Proceedings of the 2004 International Symposium on Circuits and Systems, published 23-26 May 2004, Volume: 2, page(s): II-369-72 Vol. 2.

h. "Small area parallel Chien search architectures for long BCH codes", Yanni Chen; Parhi, K. K. Very Large Scale Integration (VLSI) Systems, IEEE Transactions on. Volume 12, Issue 5, May 2004 Page(s): 545-549. Digital Object Identifier 10.1109/TVLSI.2004.826203.

The following terms may be construed either in accordance with any definition thereof appearing in the prior art literature or in accordance with the specification, or as follows:

Block=a set of flash memory device cells which must, due to physical limitations of the flash memory device, be erased together. Also termed erase sector, erase block.

Cell: A component of flash memory that stores one bit of information (in single-level cell devices) or n bits of information (in a multi-level device having 2 exp n levels). Typically, each cell comprises a floating-gate transistor. n may or may not be an integer. "Multi-level" means that the physical levels in the cell are, to an acceptable level of certainty, statistically partitionable into multiple distinguishable regions, plus a region corresponding to zero, such that digital values each comprising multiple bits can be represented by the cell. In contrast, in single-level cells, the physical levels in the cell are assumed to be statistically partitionable into only two regions, one corresponding to zero and one other, non-zero region, such that only one bit can be represented by a single-level cell.

Charge level: the measured voltage of a cell which reflects its electric charge.

Cycling: Repeatedly writing new data into flash memory cells and repeatedly erasing the cells between each two writing operations.

Decision regions: Regions extending between adjacent decision levels, e.g. if decision levels are 0, 2 and 4 volts respectively, the decision regions are under 0 V, 0 V-2 V, 2V-4 V, and over 4 V.

Demapping: basic cell-level reading function in which a digital n-tuple originally received from an outside application is derived from a physical value representing a physical state in the cell having a predetermined correspondence to the digital n-tuple.

Digital value or "logical value": n-tuple of bits represented by a cell in flash memory capable of generating 2 exp n distinguishable levels of a typically continuous physical value such as charge, where n may or may not be an integer.

Erase cycle: The relatively slow process of erasing a block of cells (erase sector), each block typically comprising more than one page, or, in certain non-flash memory devices, of erasing a single cell or the duration of so doing. An advantage of erasing cells collectively in blocks as in flash memory, rather than individually, is enhanced programming speed: Many cells and typically even many pages of cells are erased in a single erase cycle.

Erase-write cycle: The process of erasing a block of cells (erase sector), each block typically comprising a plurality of pages, and subsequently writing new data into at least some of them. The terms "program" and "write" are used herein generally interchangeably.

Flash memory: Non-volatile computer memory including cells that are erased block by block, each block typically comprising more than one page, but are written into and read from, page by page. Includes NOR-type flash memory, NAND-type flash memory, and PRAM, e.g. Samsung PRAM, inter alia, and flash memory devices with any suitable number of levels per cell, such as but not limited to 2, 4, or (as in the embodiment illustrated herein) 8.

Mapping: basic cell-level writing function in which incoming digital n-tuple is mapped to a program level by inducing a program level in the cell, having a predetermined correspondence to the incoming logical value.

Page=A portion, typically 512 or 2048 or 4096 bytes in size, of a flash memory e.g. a NAND or NOR flash memory device. Writing can be performed page by page, as opposed to erasing which can be performed only erase sector by erase sector. A few bytes, typically 16-32 for every 512 data bytes are associated with each page (typically 16, 64 or 128 per page), for storage of error correction information. A typical block may include 32 512-byte pages or 64 2048-byte pages.

Precise read, soft read: Cell threshold voltages are read at a precision (number of bits) greater than the number of Mapping levels ($2^n$). The terms precise read or soft read are interchangeable. In contrast, in "hard read", cell threshold voltages are read at a precision (number of bits) smaller than the number of Mapping levels ($2^n$ where n=number of bits per cell).

Present level, Charge level: The amount of charge in the cell. The amount of charge currently existing in a cell, at the present time, as opposed to "program level", the amount of charge originally induced in the cell (i.e. at the end of programming).

Program: same as "write".

Program level (programmed level, programming level): amount of charge originally induced in a cell to represent a given logical value, as opposed to "present level".

Reprogrammability (Np): An aspect of flash memory quality. This is typically operationalized by a reprogrammability parameter, also termed herein "Np", denoting the number of times that a flash memory can be re-programmed (number of erase-write cycles that the device can withstand) before the level of errors is so high as to make an unacceptably high proportion of those errors irrecoverable given a predetermined amount of memory devoted to redundancy. Typically recoverability is investigated following a conventional aging simulation process which simulates or approximates the data degradation effect that a predetermined time period e.g. a 10 year period has on the flash memory device, in an attempt to accommodate for a period of up to 10 years between writing of data in flash memory and reading of the data therefrom.

Resolution: Number of levels in each cell, which in turn determines the number of bits the cell can store; typically a cell with $2^n$ levels stores n bits. Low resolution (partitioning the window, W, of physical values a cell can assume into a small rather than large number of levels per cell) provides high reliability.

Retention: of original physical levels induced in the cells; retention is typically below 100% resulting in deterioration of original physical levels into present levels.

Retention time: The amount of time that data has been stored in a flash device, typically without, or substantially without, voltage having been supplied to the flash device i.e. the time which elapses between programming of a page and reading of the same page.

Symbol: Logical value

Threshold level: the voltage (e.g.) against which the charge level of a cell is measured. For example, a cell may be said to store a particular digital n-tuple D if the charge level or other physical level of the cell falls between two threshold values T.

Unless specifically stated otherwise, as apparent from the following discussions, it is appreciated that throughout the specification discussions, utilizing terms such as, "processing", "computing", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic; quantities within the computing system's registers and/or memories into other data similarly represented as physical quantities within the computing system's memories, registers or other such information storage, transmission or display devices.

The disclosures of all publications and patent documents mentioned in the specification, and of the publications and patent documents cited therein directly or indirectly, are hereby incorporated by reference.

SUMMARY OF THE INVENTION

BCH and RS (Reed-Solomon) are among the most widely used cyclic error correcting codes. They are used in various practical fields such as storage and communication. When these coding schemes are used in mobile applications, power consumption is a major design constraint which sometimes even affects the actual viability of the applicability of the schemes to the mobile applications.

At least the decoding functionality of the above codes typically employs a Chien search. An objective of certain embodiments of the present invention is to provide low power Chien search apparatus useful for mobile applications, memory applications including flash memory applications, and other applications.

There is thus provided, in accordance with at least one embodiment of the present invention, a low power Chien searching method employing Chien search circuitry comprising at least two hardware components that compute at least two corresponding bits comprising a Chien search output, the method comprising activating only a subset of the hardware components thereby to compute only a subset of the bits of the Chien search output; and, only if a criterion on the subset of the bits of the Chien search output is satisfied, activating hardware components other than those in the subset of hardware components, to compute additional bits, of the Chien search output other than the bits in the subset of bits.

Further in accordance with at least one embodiment of the present invention, activating-only-if comprises activating all hardware components outside of the subset of the plurality of hardware components, if the Chien criterion is not satisfied by the subset of bits.

Still further in accordance with at least one embodiment of the present invention, the hardware components evaluate at least one error locator polynomial.

Additionally in accordance with at least one embodiment of the present invention, the method also comprises using the roots of the error locator polynomial to determine locations of errors in a recovered version of sequence of externally provided bits.

Further in accordance with at least one embodiment of the present invention, the sequence of externally provided bits comprises data provided by a host and the recovered version comprises a representation of the data stored in flash memory.

Additionally in accordance with at least one embodiment of the present invention, the data stored in flash memory comprises data encoded in accordance with a Reed-Solomon decoding algorithm.

Still further in accordance with at least one embodiment of the present invention, the data stored in flash memory comprises data encoded in accordance with a BCH decoding algorithm.

Additionally in accordance with at least one embodiment of the present invention, the method further comprises correcting the errors to reproduce the data provided by the host.

Also provided, in accordance with at least one embodiment of the present invention, is a method for correcting a plurality of errors occurring at a corresponding plurality of locations within a recovered version of data provided by a host, the recovered version having been stored in memory, the method comprising constructing a polynomial characterized in that roots thereof indicate locations of the errors in the recovered version of the data; and at least once, determining whether a value of the polynomial equals zero, wherein the value of the polynomial comprises a summation of a sequence of at least two bits, wherein at least once, the determining comprises determining whether each bit in only a subsequence of the sequence of bits equals zero; and subsequently determining whether at least some of the bits in the sequence of bits, other than in the subsequence of bits, equal zero, only if all bits in the subsequence equal zero.

Additionally in accordance with at least one embodiment of the present invention, the method further comprises correcting the errors to reproduce the data provided by the host.

Also provided, in accordance with at least one embodiment of the present invention, is an apparatus for finding roots of a polynomial defined over a finite field, the roots configured to represent location of errors within a recovered version of data, the apparatus comprising polynomial root finding apparatus operatively configured to find roots of a polynomial which is a weighted sum of powers of a variable, the weighted sum being defined by a variable and by a sequence of coefficients by which the powers of the variable are respectively multiplied, the polynomial having a value given an individual sequence of coefficients and given an individual value for the variable, the polynomial root finding apparatus comprising polynomial value determination apparatus operative to determine, for at least one given individual sequence of coefficients and individual value for the variable, whether the value of the polynomial, given the individual sequence of coefficients and the individual value for the variable, equals zero, wherein the value of the polynomial comprises a sequence of at least two bits, the polynomial value determination apparatus comprising partial polynomial value determination apparatus operative to determine whether each bit in only a subsequence of the sequence of bits equals zero; and selectively activatable complementary polynomial value determination apparatus operative to determine whether at least some of the bits in the sequence of bits other than in the subsequence equal zero, only if all bits in the subsequence equal zero.

Further in accordance with at least one embodiment of the present invention, the partial polynomial value determination apparatus comprises a multiplier which is always active and the selectable activatable apparatus is activated only if an Error Locator Polynomial evaluation of the bits in the subsequence is equal to 1.

Further in accordance with at least one embodiment of the present invention, the apparatus also comprising a register upstream of the selectable activatable apparatus.

Still further in accordance with at least one embodiment of the present invention, the bits included in the subsequence of bits comprise the first, lower bits in the sequence.

Additionally in accordance with at least one embodiment of the present invention, the bits included in the subsequence of bits are non-consecutive in the sequence.

Further in accordance with at least one embodiment of the present invention, the hardware components are operative for finding roots of a polynomial which is a weighted sum of powers of a variable, the weighted sum being defined by a variable and by a sequence of coefficients by which the powers of the variable are respectively multiplied, the polynomial having a value given an individual sequence of coefficients and given an individual value for the variable, the value comprising the Chien search output, the finding including determining, for at least one given individual sequence of coefficients and individual value for the variable, whether the value of the polynomial, given the individual sequence of coefficients and the individual value for the variable, equals zero, wherein the value of the polynomial comprises a sequence of at least two bits.

Further in accordance with at least one embodiment of the present invention, the criterion is whether each of the bits in the subset of bits equals zero.

Still further in accordance with at least one embodiment of the present invention, the subsequently determining comprises determining whether all of the bits in the sequence of bits, other than in the subsequence of bits, equal zero, only if all bits in the subsequence equal zero.

Additionally in accordance with at least one embodiment of the present invention, the subsequently determining comprises determining whether only some of the bits in the sequence of bits, other than in the subsequence of bits, equal zero, only if all bits in the subsequence equal zero; and subsequently determining whether at least some of the bits in the sequence of bits, other than the some bits and the bits in the subsequence of bits, equal zero, only if all of the some bits equal zero and all of the bits in the subsequence equal zero.

Also provided, in accordance with at least one embodiment of the present invention, is a low power Chien searching system employing Chien search circuitry comprising at least two hardware components that compute at least two corresponding bits comprising a Chien search output, the system comprising subset activation apparatus operative to activate only a subset of the hardware components thereby to compute only a subset of the bits of the Chien search output; and polynomial evaluation completion activation apparatus operative, only if a criterion on the subset of the bits of the Chien search output is satisfied, to activate hardware components other than those in the subset of hardware components, to compute additional bits of the Chien search output other than the bits in the subset of bits.

Further in accordance with at least one embodiment of the present invention, the subset of bits comprises a number of bits c which minimizes the power used by the hardware components to perform the activating step and the only-if-activating step.

Also provided, in accordance with at least one embodiment of the present invention, is a method for saving power consumed by hardware components, the hardware components operatively configured to perform a Chien search, the method comprising providing the hardware components, and initiating the Chien search utilizing only a selective subset of the hardware components whereby power consumption is lower compared with power consumed in a Chien search utilizing all of the hardware components.

Further in accordance with at least one embodiment of the present invention, the Chien search is utilized to determine locations of errors in a recovered version of sequence of externally provided bits.

Still further in accordance with at least one embodiment of the present invention, the sequence of externally provided bits comprises data provided by a host and the recovered version comprises a representation of the data stored in flash memory.

Further provided, in accordance with at least one embodiment of the present invention, is an error correction decoder comprising an error locator polynomial generator operative to generate at least one error locator polynomial; and an error locator polynomial evaluator operative to rule out at least one root of the error locator polynomial based on only a partial evaluation thereof.

Any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic, phenomena which may occur or reside e.g. within registers and/or memories of a computer.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories, into other data similarly represented as physical quantities within the computing system's memories, registers or other such information storage, transmission or display devices.

BRIEF DESCRIPTION OF THE DRAWINGS

Certain embodiments of the present invention are illustrated in the following drawings:

FIG. 5B is a diagram showing the inputs and outputs of an individual one of the multipliers of FIG. 5A, according to a two-precision mode embodiment of the apparatus of FIG. 5A in which multiplication is effected either at full-precision or with partial precision;

FIG. 6 is a table defining various power parameters used in power computations described herein;

FIGS. 7A-7E are simplified electronic diagrams of five alternative implementations of an individual one of the multipliers of FIG. 5A, constructed and operative in accordance with the two-precision mode embodiment of FIG. 5B;

DETAILED DESCRIPTION OF CERTAIN EMBODIMENTS

Figure 1A:
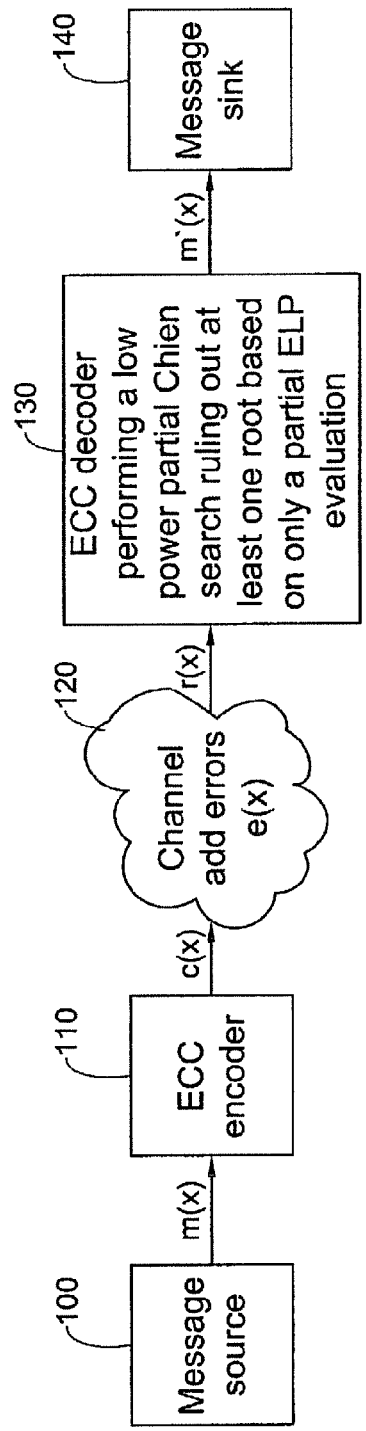
FIG. 1A is a simplified functional block diagram of an encoding/decoding system using a low power partial Chien search operative to rule out at least one root of an error locator polynomial based on only a partial evaluation of the polynomial, the system being constructed and operative in accordance with certain embodiments of the present invention.

Reference is now made to FIG. 1A which is a simplified functional block diagram of an encoding/decoding system using a low power partial Chien search operative to rule out at least one root of an error locator polynomial based on only a partial evaluation of the polynomial, the system being constructed and operative in accordance with certain embodiments of the present invention. In FIG. 1A, a message source 100 provides a message m(x) which it may be desired to transmit or to store, e.g. in flash memory, to Error Correction Coding (ECC) apparatus 110. The ECC apparatus 110 may comprise BCH or Reed-Solomon cyclic error correction coding apparatus and is typically operative for computing and for adding, to the message m(x), redundancy bits, thereby to generate a codeword c(x) of a known codebook such as BCH or Reed-Solomon with known parameters. The channel 120, which may comprise any medium through which the message is conveyed from transmitter 100 to receiver 130, or may comprise the storage medium, adds errors e(x) to the codeword c(x).

The errors may stem from various physical processes such as thermal noise, deterioration of storage medium over time and, especially after many read/write operations, inaccuracies in the transmitter or receiver hardware. Each error occurs at a particular location within the message, which is assumed to comprise a sequence of bits or of symbols. In the former case, binary BCH code is typically used for encoding and decoding, whereas in the latter case, non-binary BCH code, or RS code is used. In the first, binary, instance, n is used in the foregoing discussion to indicate a bit of the data being read or received in which an error has occurred. In the second, non-binary, instance, n is used in the foregoing discussion to indicate a symbol of the data being read or received in which an error has occurred.

r(x)=c(x)+e(x) is the received data which is typically received by an error correcting decoder 130, also termed herein the "receiver". The receiver 130, using the redundancy that was added to the message and the known codebook, is operative to substantially reconstruct the original message m'(x) and convey it to the intended target, message sink 140. According to certain embodiments of the present invention, the decoder 130 is operative to perform a low power partial Chien search operative to rule out at least one root of an error locator polynomial based on only a partial evaluation of the polynomial, e.g. as described and illustrated below.

Figure 1B:
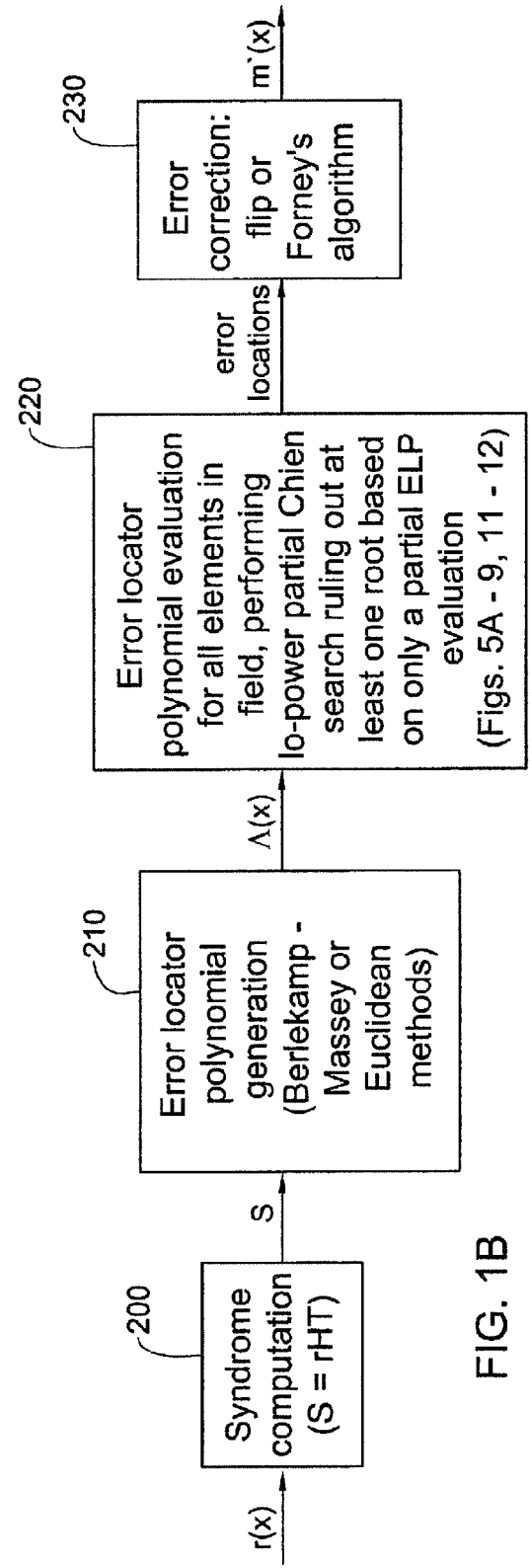
FIG. 1B is a simplified functional block diagram of the decoder of FIG. 1A, which uses a low power partial Chien search operative to rule out at least one root of an error locator polynomial based on only a partial evaluation of the polynomial, which is constructed and operative in accordance with certain embodiments of the present invention.

Reference is now made to FIG. 1B which is a simplified functional block diagram of the decoder 130 of FIG. 1A. As shown, the decoder 130 uses a low power partial Chien search operative to rule out at least one root of an error locator polynomial based on only a partial evaluation of the polynomial, and is constructed and operative in accordance with certain embodiments of the present invention.

As described above, the encoder 110 can be described in terms of a generation matrix G, thus the encoding process performed by encoder 110 comprises a matrix multiplication c=mG. As described above, c is the transmitted codeword and m is the message to be transmitted or, for data storage applications, the data to be stored. The decoder of FIG. 1B is operative to perform syndrome decoding (functionality 200), such that there exists a parity check matrix H which has the following property: $GH^T=0$. It follows that $cH^T=mGH^T=0$ (formula IV). As described above, the received vector r comprises the transmitted codeword c and the errors added in the channel 120 i.e. r=c+e. The "receiver" 130 (which in flash memory applications, may be implemented within microcontroller 244 of FIG. 2) computes the syndrome vector s using the parity check matrix. Specifically (formula V):

$$s=rH^T=cH^T+eH^T=mGH^T+eH^T=0+eH^T=eH^T, \text{ or in short } s=eH^T.$$

Another functionality in a conventional decoder is that which generates an Error Locator Polynomial (functionality 210 in FIG. 1B). Due to the special form of the BCH and RS codes and of the parity check matrix H the set of equations $s=eH^T$ may be solved directly by exhaustive search in the decoder 130 to find the error vector e and correctly decode the received message r(x), however, the exhaustive search is computationally unattractive. Therefore, typically an Error Locator Polynomial (ELP) is introduced, the roots of which correspond to a one to one mapping of the error locations as described above and as is known in the art.

If $A=\Lambda_1 \alpha^i + \Lambda_2 \alpha^{2i} + \ldots + \Lambda_J \alpha^{Ji}$ equals $\Lambda_0$ at some clock n, this implies, as described above and as known in the art, that $\alpha^i$ is a root of the Error Locator Polynomial (ELP). This in turn implies, if binary BCH code is being used, that an error has occurred in bit n of the data being read or received. If non-binary BCH code, or RS code, is used, the fact that $\alpha^i$ is a root of the Error Locator Polynomial (ELP) implies that an error has occurred in symbol n of the received or read data. Known algorithms for deriving the Error Locator Polynomial (ELP) from the syndromes include the Berlekamp-Massey and the Euclidean algorithms as described e.g. in "Error Correction Coding Mathematical Methods and Algorithms", Todd K. Moon, John Wiley & Sons, Inc., 2005. It is assumed that the ELP is normalized that the first monomial (of $X^0$), $\Lambda_0$, is normalized to 1. In the case of BCH this is indeed the case whereas in the case of RS, multiplying the ELP by the inverse of the monomial of $X^0$ ensures this is the case.

The Error Locator Polynomial A generated by unit 210 can be written as follows (formula VI):

$$\Lambda(x)=\Lambda_0+\Lambda_1 x+\Lambda_2 x^2+\ldots+\Lambda_J x^J$$

where J is the number of errors in the received vector. In the assumed, i.e. worst, case, j=J=the maximum number of errors that the error correction algorithm is able to correct per (page or block of) n symbols. The n symbols comprise n bits if an BCH algorithm is used or n symbols if a RS algorithm is used. The symbols $\Lambda_j$ and $\lambda_j$ are used interchangeably. In the formulae and drawings herein, J and t are used interchangeably, e.g. j=1, ... J or j=1, ... t.

Once the Error Locator Polynomial (ELP) has been generated by functionality 210, Error Locator Polynomial evaluation functionality 220 then evaluates the Error Locator Polynomial for all the elements of the field over which the Error Locator Polynomial is defined. The elements in the field that zero the Error Locator Polynomial (ELP) are the error locations. Computations are typically performed in the $GF(q^m)$ field which is a finite field.

Denoting α as a primitive element, all the field elements can be conventionally generated from consecutive powers of α i.e. $\alpha^0, \alpha^1, \ldots, \alpha^{q^m}$.

Errors are then corrected at each error location identified, by unit 230 of FIG. 1B. If the code is binary, correction comprises a simple flip of the bit. If the code is non-binary, error value computation typically uses Forney's algorithm. It is appreciated that typically, Error Locator Polynomial (ELP) evaluation described above uses a Chien-Search to find or search for all the roots of λ(x). To do this, x is typically evaluated for all powers of a i.e. $x=1, \alpha, \alpha^2, \alpha^3, \ldots, \alpha^{q^m}$. This can, for example, be effected by the conventional ELP-evaluation-by-Chien-search apparatus depicted in prior art FIG. 3 or alternatively it may be effected by a low power partial Chien search operative to rule out at least one root of an error locator polynomial based on only a partial evaluation of the polynomial, e.g. as described in detail below with reference to FIGS. 5A-9, 11-12.

Figure 2:
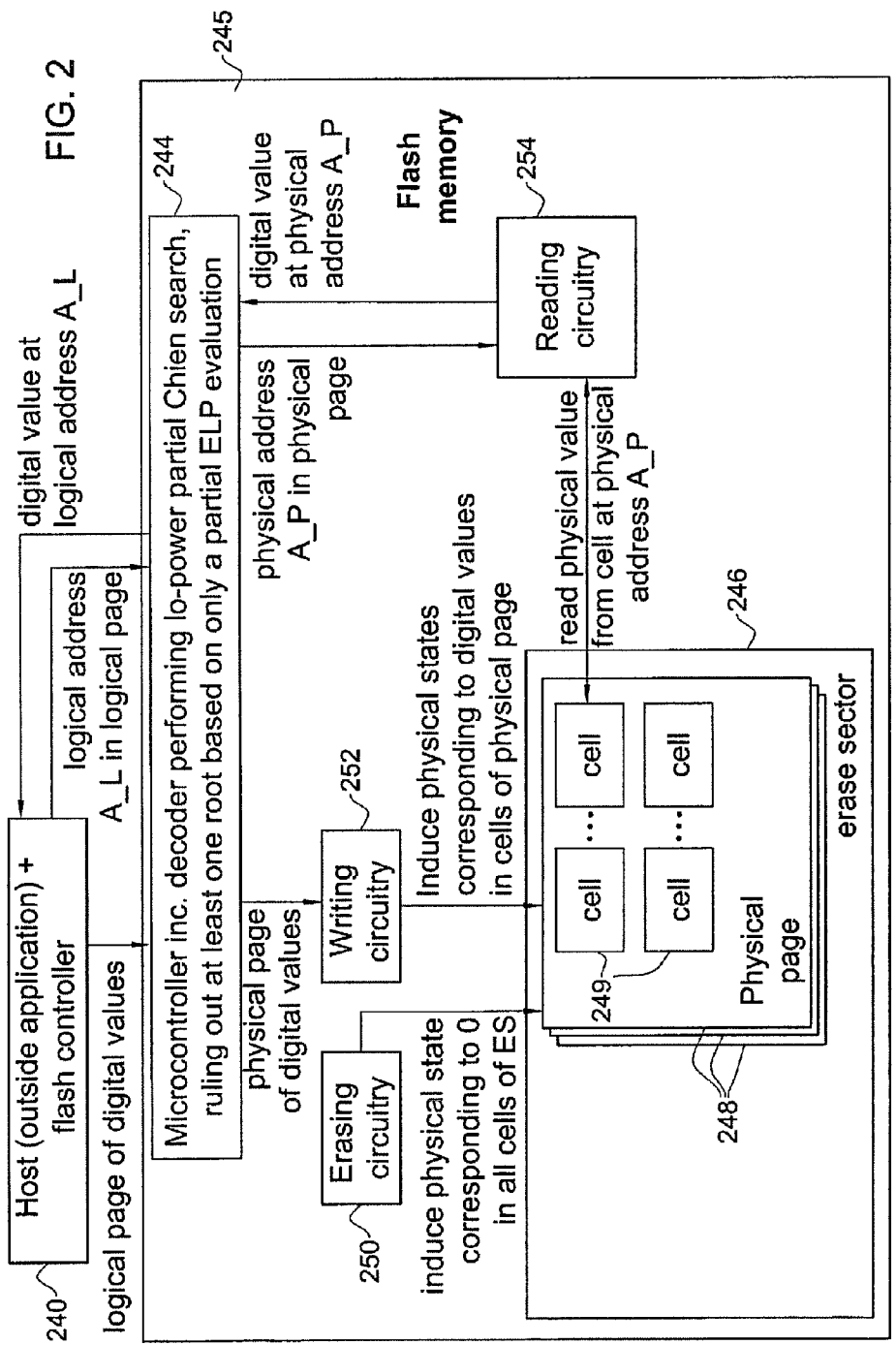
FIG. 2 is a simplified functional block diagram of flash memory apparatus comprising, e.g. in an internal microcontroller, the encoding/decoding system of FIG. 1A and particularly the decoder of FIG. 1B, all operative in accordance with certain embodiments of the present invention.

FIG. 2 is a simplified functional block diagram of a flash memory apparatus comprising, e.g. in an internal microcontroller 244, the encoding/decoding system of FIG. 1A and particularly the decoder of FIG. 1B, all operative in accordance with certain embodiments of the present invention. As shown, the flash memory apparatus of FIG. 2 so typically interacts with a host 240 and typically includes the microcontroller 244 as well as one or more erase sectors 246 each comprising one or more pages 248 each including cells 249. The microcontroller 244 effects erasing of, writing on and reading from the erase sector/s 246, by suitably controlling erasing circuitry 250, writing circuitry 252 and reading circuitry 254, respectively. According to certain embodiments of the present invention, microcontroller 244 includes an error correction code decoder operative to receive data from the reading circuitry 254, to decode the data, including performing a low-power Chien search for error locations, including a partial Chien search, operative to rule out at least one root of an error locator polynomial based on only a partial evaluation of the polynomial, e.g. as described in detail below with reference to FIGS. 5A-9, 11-12, and to provide the data thus decoded to the host 240 which therefore constitutes both source 100 and sink 140 of FIG. 1A, in memory applications.

In flash memory applications, the channel 120 generally represents the deterioration in the data stored in memory over time and due to repeated cycling, and the encoding and decoding (functionalities 110 and 130 in FIG. 1A) are performed within one or more suitable controllers e.g. the microcontroller 244 of FIG. 2 which is external to the flash memory device 245 or an external controller operatively associated with the host 240 and external to device 245.

Figure 3:
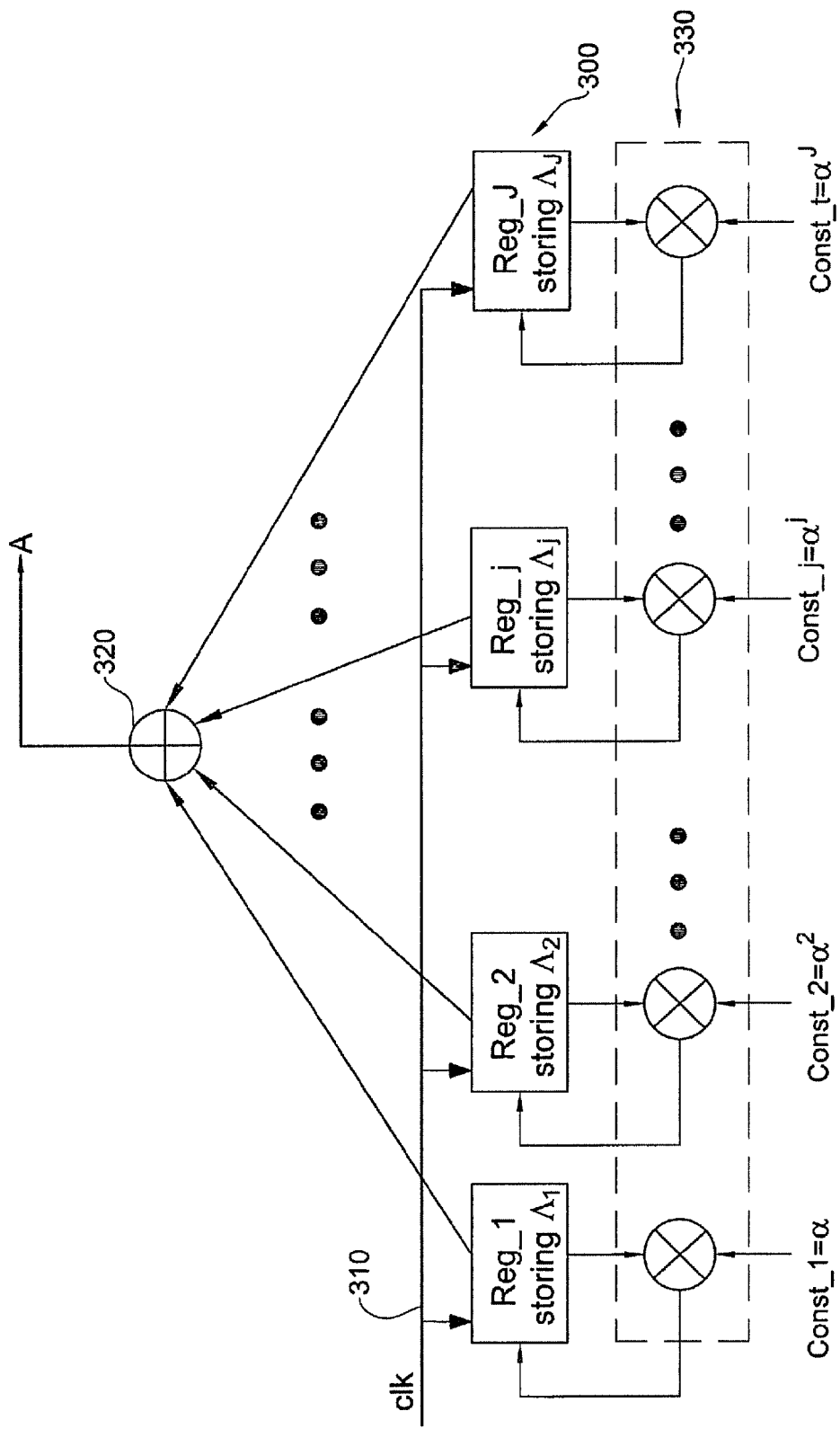
FIG. 3 is a functional block diagram illustration of an "in series" prior art alternative for blocks 220 and 230 of FIG. 1B, in which polynomial evaluation proceeds for each _i in series for a field over GF(2q)

As described above, evaluation of an error locator polynomials for all elements in the field over which the polynomial is defined, may be performed using a conventional Chien search. This is shown in FIG. 3 which is a functional block diagram illustration of an "in series" prior art alternative for blocks 220 and 230 of FIG. 1B. In FIG. 3, Reg_1 to Reg_J are J registers 300 which are initiated prior to the beginning of operation to hold $\Lambda_1 \ldots \Lambda_J$, i.e. the coefficients of the Error Locator Polynomial (ELP) where J is the error correction capability of the designed code. The symbol j does not denote a constant over multiple operations of the circuit, but rather varies and denotes the number of errors in the currently decoded data block. The clk signal 310 in FIG. 3 denotes the clock signal that clocks the Reg_1 ... Reg_J registers 300. Const_1 ... Const_J in FIG. 3 are successive powers of the primitive element in the field α.

In each successive clock of clk signal 310, the contents of each register Reg_1 ... Reg_J (which are initially respective Λ values as shown) are multiplied by the respective constants Const_1 ... Const_J and latched into respective ones of the Reg_1 ... Reg_J registers as shown. An adder 320 in FIG. 3 adds the partial sums of the Error Locator Polynomial (ELP) to produce sum A which is the evaluation of the Error Locator Polynomial (ELP) for $x=\alpha^i$ at the i'th clock cycle. If A equals $\Lambda_0$ at some clock n, this implies, as described above and as known in the art, that $\alpha^i$ is a root of the Error Locator Polynomial (ELP). This in turn implies, if binary BCH code is being used, that an error has occurred in bit n of the data being read or received. If non-binary BCH code, or RS code, is used, the fact that a' is a root of the Error Locator Polynomial (ELP) implies that an error has occurred in symbol n of the received or read data. Once the algorithm iterates over all elements in the field, and all the errors are identified, the decoding process is complete.

As described above, the Chien-Search algorithm performs evaluation of the Error Locator Polynomial (ELP) for all the elements in the field in order to find Error Locator Polynomial s roots which are the error locations. That is, for each $x=\alpha^0, \alpha^1, \ldots, \alpha^{q^m-2} \Lambda(x)$ is evaluated, thereby to obtain an element in $GF(q^m)$. If that element is equal to 0, an error is declared to have occurred at the respective location. Typically, only the sum of the last J monomials of Λ(x) (sum=$\Lambda_1 \alpha^{i} + \Lambda_2 \alpha^{2i} + \ldots + \Lambda_J \alpha^{Ji}$) is evaluated and the sum is compared to −1; if the sum is −1 then the evaluation of Λ(x) at that point is 0. Each element in $GF(q^m)$ may be defined by m sub-elements over GF(q). According to certain embodiments of the invention, e.g. as may be appreciated with reference to steps 1030, 1124, 1224 and 1330 described below, the power consumption of the Chien Search is reduced by computing the result for only the first c<m sub-elements and comparing these sub-elements to −1, thus sometimes saving the power needed to compute the other m-c sub-elements, where c is any number less than m. It is appreciated that in the $GF(2^q)$ field, $-1=1$.

Even though the first c sub-elements over GF(q) may be −1, it is not necessarily the case that the rest of the c-m sub-elements will be −1. Therefore, some false alarms may occur. However, as explained in further detail below, it is not generally necessary to reevaluate this polynomial for all m sub-elements every time the first m sub-elements are detected to be −1.

In FIG. 3, the Error Locator Polynomial (ELP) is evaluated iteratively, using intermediate results of previous computations, as stored in the registers Reg_1 ... Reg_J (which hold multiples of $\Lambda_1, \Lambda_2, \ldots, \Lambda_J$). Given the current intermediate results the first c sub-elements of the polynomial for the next step can be evaluated as described in detail hereinbelow. However, if it is desired for all intermediate results to contain all m sub-elements, then, for the next computation intermediate results with m sub-elements each are still needed. However, as described below, this potential complication may be mitigated, yielding a significant power saving, for some multiplication implementations.

Figure 4:
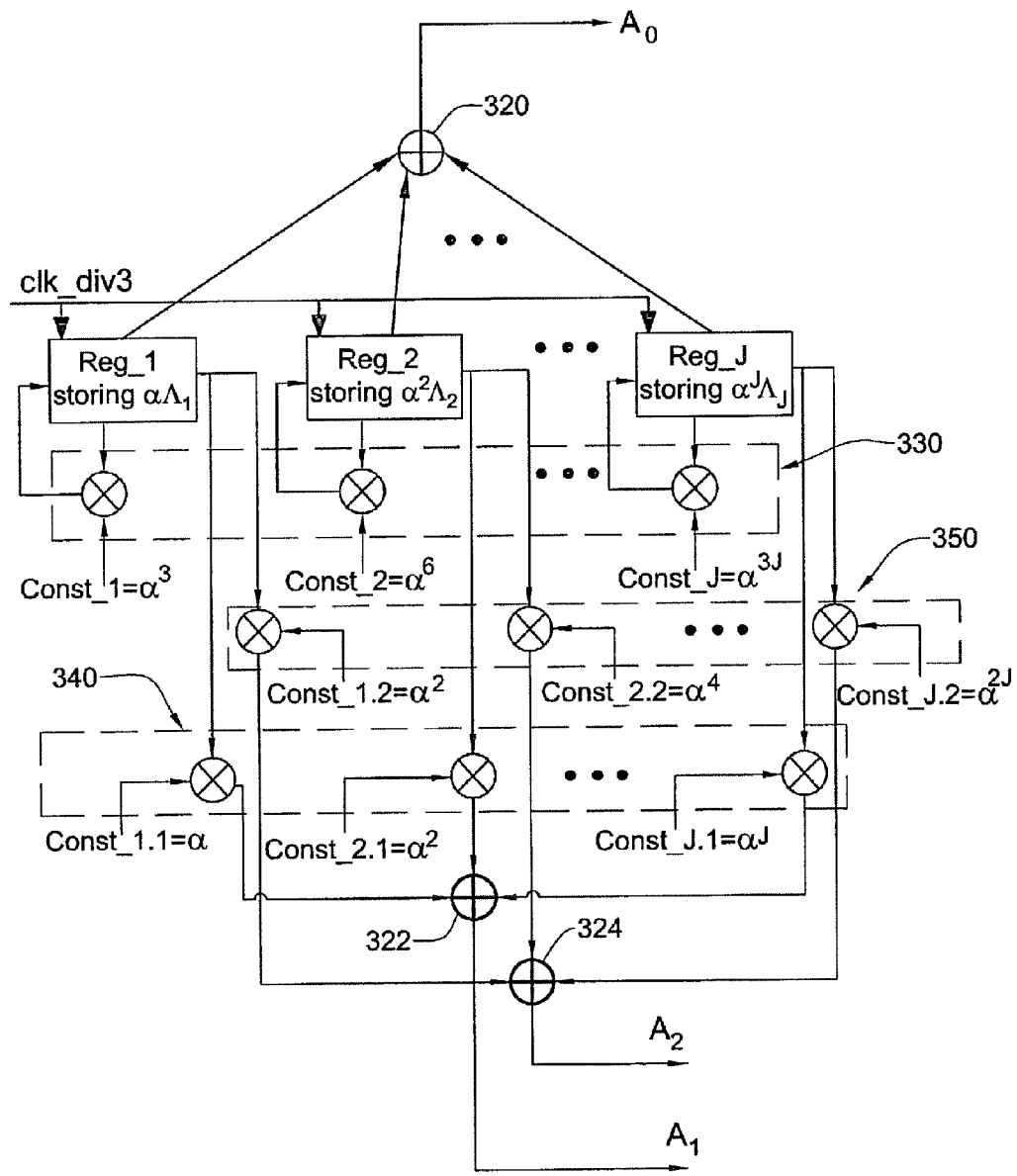
FIG. 4 is a prior art functional block diagram illustration of an "in parallel" prior art alternative for blocks 220 and 230 of FIG. 1B, having registers whose initial contents are respective Λ values as shown, in which polynomial evaluation proceeds for N different values of _i in parallel for a field over GF(2q)

FIG. 4 is a prior art functional block diagram illustration of an "in parallel" prior art alternative for blocks 220 and 230 of FIG. 1B.

According to certain embodiments of the present invention, the prior art apparatus of FIG. 3 may be modified, as shown in FIG. 4, by adding additional hardware to parallelize the computations to occur at N evaluation points in parallel, where N, the parallelization factor, is a suitable integer such as 3, 4 or 5 (N=3 in the illustrated embodiment). Parallelization may be accomplished by adding N−1 additional multipliers per register (for each of J registers, in the illustrated embodiment) and the operational clock frequency is reduced by a factor of N. At each cycle the registers (Reg_1 ... Reg_J)

are updated by multiplying them by the same amount which would have been updated following N clock cycles in the apparatus of FIG. 3. Thus, for every Nth polynomial evaluation, all intermediate results are still computed with full precision, i.e., all m sub-elements are computed for all multiplications. For example, for RS codes over $GF(2^m)$ there are m sub-elements, each comprising a bit. For RS codes over $GF(3^m)$ there are m sub elements, each comprising a symbol having 3 possible values: 0, 1 and 2.

However, these intermediate results can now be relied upon to evaluate the first c sub-elements of the Error Locator Polynomial (ELP) for the other N−1 evaluation points, as described below, enabling a significant power saving and circumventing the complication described above. The constants are powers (exponents) of the prime element in the field, alpha. Assuming the field described above, alpha=2, however this is not intended to be limiting.

In the embodiment illustrated in FIG. 4, N=3. Thus, in FIG. 4, N−1=2 additional multipliers were added for each of the J registers. Specifically, multiplier array 330 of FIG. 3 is augmented with additional multiplier arrays 340 and 350. The multipliers in array 330 are termed herein mult_1 to mult_J. The multipliers in array 340 are termed herein mult_1.1 to mult_J.1. The multipliers in array 350 are termed herein mult_1.2 to mult_J.2. In the illustrated example, A0, A1 and A2 represent N=3 different evaluations of the Error Locator Polynomial (ELP) for N=3 consecutive elements of the field and N−1=2 more adders 322 and 324 are provided to sum-up the additional two evaluations of the Error Locator Polynomial (ELP), A1 and A2 respectively. In addition the constants Const_1 . . . Const_J are updated to account for 3 consecutive polynomial evaluations for each clk cycle and the clock frequency is reduced by a factor of N=3.

It is appreciated that the power consumption of the apparatus of FIG. 4 is less than that of the apparatus of FIG. 3 even if all multipliers conventionally use full precision multiplications for all multipliers. This is because the clock frequency to the registers has been reduced and the power consumption at the registers is proportional to the elk frequency.

Figure 5A:
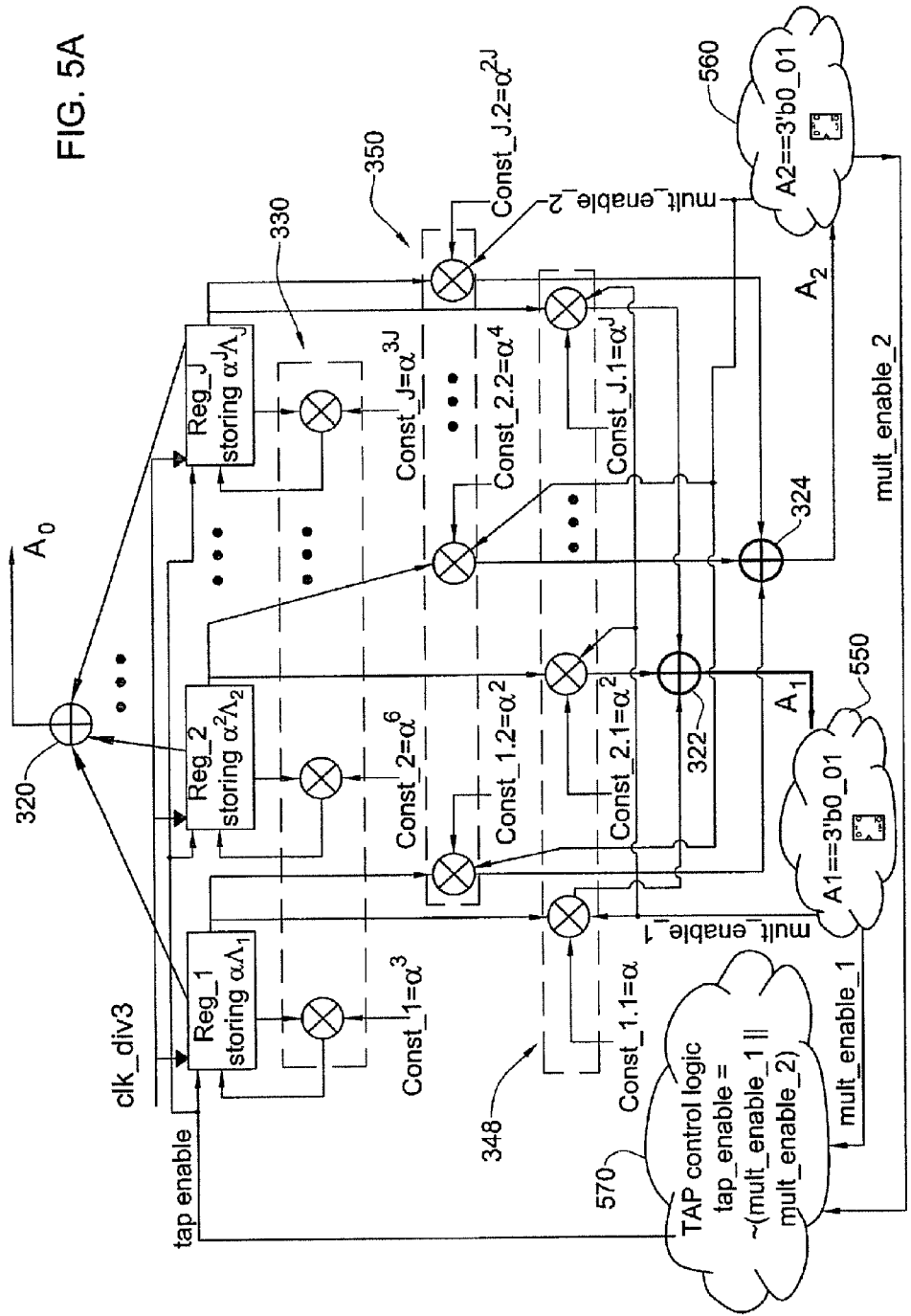
FIG. 5A is a simplified functional block diagram illustration of an "in parallel" implementation of blocks 220 and 230 of FIG. 1B, having registers whose initial contents are as shown, which effects a two-mode low power partial Chien search characterized in that searching is only sometimes performed at high precision, and at other times is performed only at low precision, all in accordance with certain embodiments of the present invention.

FIG. 5A is a simplified functional block diagram illustration of an "in parallel" implementation of blocks 220 and 230 of FIG. 1B, which effects a two-mode low power partial Chien search characterized in that searching is only sometimes performed at high precision, and at other times is performed only at low precision, all in accordance with certain embodiments of the present invention.

Prior art FIG. 4 is general in that the field over which the multiplication operations are defined is not specified. In FIG. 5A, in contrast, the field over which the multiplication operations are defined is $GF\ 2^{15}$ such that each full-precision multiplication result comprises 15 bits (J=15). More importantly, whereas in FIG. 4 each multiplier has only one mode of operation (full precision e.g. all 15 bits if the field is $GF\ 2^{15}$), in FIG. 5A, according to certain embodiments of the present invention, multipliers 350 and 348 each have two modes of operation, a full-precision mode of operation in which all 15 bits of the multiplication result, A2, are computed and a limited precision mode of operation in which only 3 bits of the multiplication result, A1, are computed. The expanded modes of operation of multipliers 350 and 348 are enabled by special signals mult_enable_2 and mult_enable_1 respectively.

It is appreciated that in the embodiment of FIG. 5A the power of the multipliers in arrays 348 and 350 is reduced, relative to the embodiment of FIG. 4, because the multiplier arrays 348 and 350 initially compute only c out of m sub-elements of the multiplications. An enable signal is used, typically for each array, which enables or disables the computation of the rest of the m-c sub-elements. In the illustrated embodiment, the enable signal for multiplier array 348 is termed mult_enable_1, and the enable signal for multiplier array 350 is termed mult_enable_2. In the event that the computation of m-c sub-elements is disabled, toggling of the appropriate circuitry is inhibited and the power consumption is reduced.

As an example, consider a code over the $GF(2^{15})$ field for an application in which the multipliers are constructed to produce (during normal operation) only the 3 LSB bits of A2, the full 15 bit result. If the element being evaluated happens to be a root of the Error Locator Polynomial (ELP), the results are 15'b000_0000_0000_0001 (summation over all the taps). The 3 lower bits of the summation are equal to 3'b0_01. Only when this result is encountered further evaluation of the rest of the bits is effected. Computing only the first 3 bits of the multiplication result A2 consumes approximately ⅕ of the power of computing the full 15 bit result.

If there is no root for the current computed position, the event that the computed 3 bits summation is equal to 3'b0_01 occurs, on average, only once in 8 positions, such that the full amount of power is expended only, at most, once every 8 clock cycles. If further evaluation is needed, an additional clock cycle may be employed to perform this computation by delaying the advance of the tap's registers and setting a tap enable signal high to allow full bit computation. The new delay of the Chien Search computation is then 9/8 of the previous delay.

Multiplier enable generation logic blocks 550 and 560 generate the multiplier enable signals for A1 and A2 summation results respectively. These logic units generate mult_enable_1 and mult_enable_2 signals respectively, which enables full bit multiplication in each of the multipliers in arrays 348 and 350 respectively. mult_enable_1 is set to logic 1 when A1 is equal to 3'b001. mult_enable_2 is set to logic 1 when A2 is equal to 3'b001. Tap control logic 570 generates the tap_enable signal which stops the advance of the tap registers during the clock that is used for the full bit multiplication and summation following a suspected hit: A1=A2=3'b001.

Certain methods of operation of the prior art system of FIG. 4, in which each multiplier has only one operating mode, and of the system of FIG. 5A, in which each multipliers 348 and 350 has two operating modes, are described below with reference to the flowcharts of FIGS. 10 and 11 respectively.

FIG. 5B is a diagram showing the inputs and outputs of an individual one of the multipliers of FIG. 5A, according to a two-precision mode embodiment of the apparatus of FIG. 5A in which multiplication is effected either at full-precision or with partial precision. Generally, as shown, the operation of each of the multipliers in 330 and 340 in FIG. 5A varies as a function of the value of mult_enable_2 or mult_enable_1 respectively. It is appreciated that partial precision need not comprise 3-bit precision specifically and that any number of bits which is less than the full number of bits may be computed at the partial precision stage.

FIG. 6 is a table of power parameters useful in understanding power computations described below both to demonstrate the general utility of certain embodiments of the present invention and to best select the size/s of the subset/s of bits computed in precision modes other than full-precision mode.

As an example, consider Chien Search apparatus which, like that of FIG. 5A, is adapted for a code defined over the $GF(2^{15})$ field. If the higher—say—10 bits of a term (monomial) in the summation $A_j$ are not computed when a partial bit multiplication occurs using an AND gate with the enable signal, no switching occurs and ~⅔ of the power is saved.

A formula ($GF(q^m)$) for the total power consumed by the multipliers of FIG. 5A is now presented. $P_{reg}$ denotes the total power drawn by the registers at the original (high) frequency. $P_{mult}$ denotes the power drawn by the multiplier array in FIG. 3 at the original frequency and $P_{comb}$ is the power attributed to the combinatorial logic in FIG. 3. It is assumed that the computation of c out of m sub-elements takes c/m of the power drawn by the full multiplier. The power drawn by the circuit in FIG. 4, without sub-element computations, is equal to $P_{total} = P_{reg}/N + P_{comb}$ where $P_{comb}$ is roughly equal to $P_{mult}$.

In the apparatus of FIG. 5A, the power consumed, assuming selection of the c first bits, is approximated by the following expression (Formula VII):

$$P(c, N) = \frac{P_{reg}}{N} + \frac{P_{mult}}{N} + \frac{(N-1)}{N} \cdot P_{mult} \cdot \frac{c}{m} + \frac{(N-1)}{N} \cdot P_{mult} \cdot \frac{1}{q^c}$$

$$= \frac{P_{reg}}{N} + \frac{P_{mult}}{N} \cdot \left(1 + (N-1) \cdot \left(\frac{c}{m} + \frac{1}{q^c}\right)\right)$$

For example, when m=15, q=2, and it is desired to minimize the power consumed, P(c,N), the term $$\left(\frac{c}{m} + \frac{1}{q^c}\right) = \left(\frac{c}{15} + \frac{1}{2^c}\right)$$

may be minimized, regardless of N. One can easily check by enumerating over c=1..15 that this term is minimized when c=3 which in total saves roughly ½ of the power. In general, the higher N is, the less power may be consumed. However, N is usually limited by hardware restrictions such as but not limited to gate-count. Therefore, given N the function P(c,N) is minimized over c.

The power computations are rough and depend highly on the code construction, the constants, the field and its generator polynomial and on the process, cell-library and frequency of operation. The above computations, while based on a specific application and having many assumptions built-in e.g. as set out in FIG. 6, serve to show the utility of certain embodiments of the present invention.

One possible implementation of computing a multiplication of two elements and obtaining the result for just some of sub-elements is now described. As the arithmetic is performed over a Galois-field, the multiplication operation of elements z and y in the field can be expressed as follows: z(x)*y(x) mod p(x) where p(x) is the generator polynomial of this field and z(x) and y(x) are the polynomial representatives of the elements z and y. Thus, the following polynomial notation may be employed (formula VIII):

$$y(x) \cdot z(x) \bmod p(x) = \left(\sum_{i=0}^{m-1} y_i x^i \cdot \sum_{i=0}^{m-1} z_i x^i\right) \bmod p(x)$$

$$= \sum_{l=0}^{2m-2} \left(\sum_{k=0}^{l} z_k y_{l-k}\right) x^l \bmod p(x)$$

$$= \sum_{l=0}^{2m-2} \left[\sum_{k=0}^{l} z_k y_{l-k}\right] [x^l \bmod p(x)]$$

$$= \sum_{l=0}^{2m-2} A_l V_l(x)$$

where $$A_l = \sum_{k=0}^{l} z_k y_{l-k}$$

is a sub-element (i.e. an element in the field GF(q)) and $V_l(x) = \lfloor x^l \bmod p(x) \rfloor$ is a polynomial whose elements are in GF(q). The multiplication $A_l V_l(x)$ multiplies each of the elements in $V_l(x)$ by $A_l$ in the field GF(q). Thus, the final expression in the above development of polynomial notation shows that if y is constant, the multiplication per sub-element may be computed independently of the results from the other elements. Thus, to obtain the first c<m sub-elements of the above multiplication, only c/m of the power is required on average.

If the error locator polynomial is defined over a field $GF(2^m)$, computation of $A_l$ (e.g. A_1, . . . A_(N−1)) may be effected by a set of XOR operations on the bits of z. Thus, following a multiplication by a constant (say $y=\alpha^4$), each bit in the multiplication result, on average, is generated by m/2 XOR operations. Computing only c bits of the result would require only c*m/2 XOR operations. In contrast, the full multiplication result employs m*m/2 XORs such that the system of the present invention is seen to carry out less XOR operations and hence, to consume less power.

FIGS. 7A-7E are simplified electronic diagrams of five alternative implementations of an individual one of the multipliers of FIG. 5A, constructed and operative in accordance with the two-precision mode embodiment of FIG. 5B.

In FIG. 7A, each multiplier of FIG. 5A includes a first multiplying device 414 which produces 15 bits and an additional small multiplier 416 that produces only a 3 bit result in parallel to the multiplier 414. The larger multipliers 414 remains gated off during normal operation and is switched into action solely in the cycles where a full bit result is to be obtained because the partial result has passed the criterion i.e. equals "1". This embodiment may be less practical in certain applications due to added gate-count. In FIG. 7A, as shown, there is a 15 bit result if mult_enable==1. However, only first 3 bits of the result are computed if mult_enable==0.

Figure 7B:
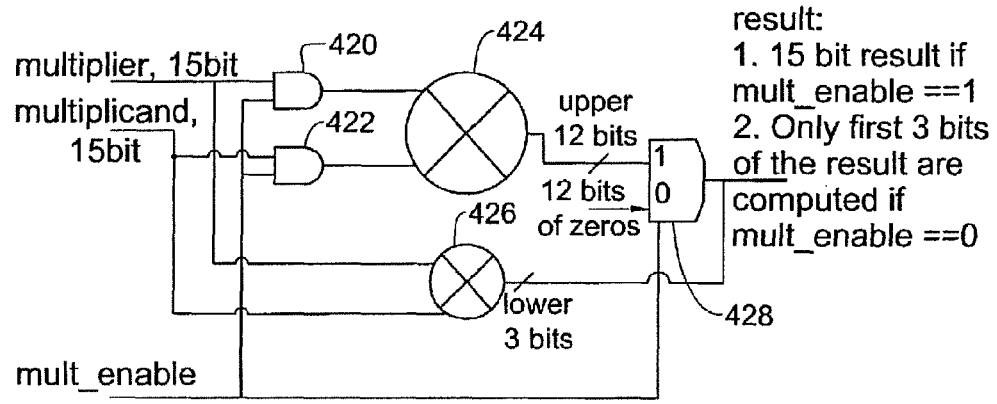

In the embodiment of FIG. 7B, the multiplier includes first and second multiplying devices 424 and 426 of which the first is the larger. The second multiplying device 426 is always active and computes the first 3 bits. A second multiplying device 424 computes the upper 12 bits and is activated only if the Error Locator Polynomial evaluation of the first 3 bits is equal to 1. It should be noted that the enable line may be driven by a control state machine which detects that the first 3 bits of the Error Locator Polynomial evaluation are different from 1 and then in the next clock performs the same computation but this time the first, larger multiplying device 424 is enabled. Another variation is to close the loop immediately after the comparator without going through the state machine. This time, everything will happen within the same clock.

Figure 7C:
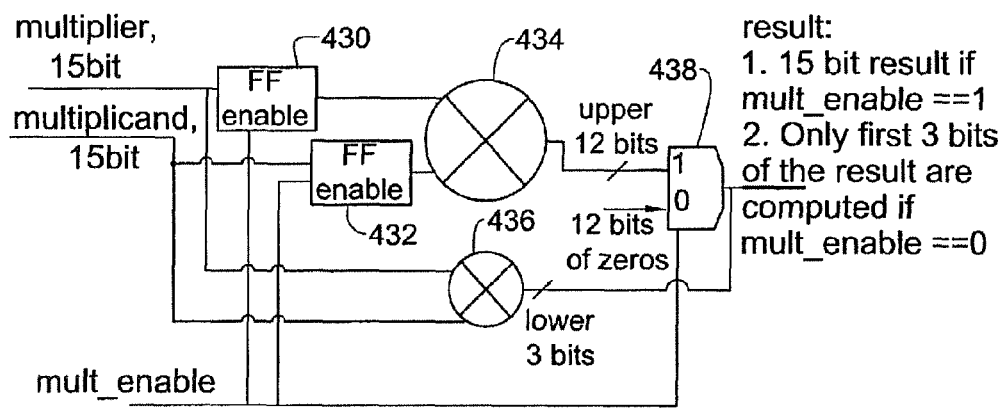

The embodiment of FIG. 7C is similar to the embodiment of FIG. 7B except that flip-flop enable registers 430 and 432 are added, as shown, upstream of the 12 bit multiplier. This assures that the inputs to the 12 bit multiplier change only once, every time the enable line goes high, rather than twice: once when the enable line goes high and once when the enable line goes low.

Figure 7D:
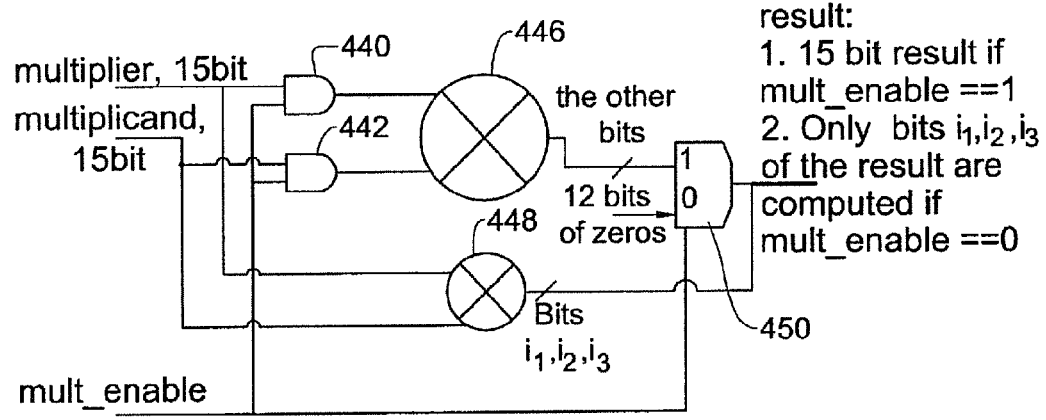

The embodiment of FIG. 7D is similar to that of FIG. 7B except that the first 3 bits always computed in the first stage, by the small multiplier 448 do not necessarily comprise the lowest 3 bits and instead may comprise any 3 bits from among the 15 bits.

Three possible modifications are now described with reference to FIGS. 7B-7D respectively. These can be used separately or in any suitable combination. To obtain the optimal set of c-sub-elements computed in FIG. 7D, the following computations may be performed:

Denote the power consumed by the multipliers in, say, FIG. 5A, for c sub-elements by $P_{mult,c}$. The term "sub-element" is used herein to denote a sub-set of the bits of an element of a finite field over which polynomials being Chien-searched are defined. The multipliers are divided into N groups of size J, where the multiplication results of each group, 350 and 348, are added up to give a c-sub-element evaluation of the Error Locator Polynomial (ELP). The power of each such group may be optimized over all choices of c-sub-elements out of m. Also, if the first sub-element is not computed, then the comparison condition (step 1030 in FIG. 10) should be 0 instead of 1.

Thus the choice of the condition may depend on the choice of the c-sub-elements which are computed, and thus may also depend on the group of multipliers. $P_{mult,c}$ is then the average power consumed by each group at the original frequency, averaged over all groups. The power drawn as a function of the selected subset of elements is then a target function which is to be minimized over all possible subsets of elements (one of which is the lowest c bits as in FIG. 7A). This target function to be minimized is given by (Formula IX):

$$P(c, N) = \frac{P_{reg}}{N} + \frac{P_{mult,m}}{N} + \frac{(N-1)}{N} \cdot P_{mult,c} + \frac{(N-1)}{N} \cdot P_{mult,m} \cdot \frac{1}{q^c}$$

$$= \frac{P_{reg}}{N} + \frac{P_{mult,m}}{N} \cdot \left(1 + \frac{(N-1)}{q^c}\right) + \frac{P_{mult,c}}{N}(N-1)$$

One example is where $P_{mult,c}$ does not depend on the c-sub-elements chosen for the computation. In this case, replacing the apparatus of FIG. 7D by the apparatus of FIG. 7B would give equivalent results.

One additional clock cycle is activated each time the c-sub-element evaluation of the polynomial gives a suspect result. This could be avoided if the rest of the m-c sub-elements are computed on the same clock. This may be achieved by connecting the Error Locator Polynomial (ELP) evaluation condition checker (blocks 550 and 560 in FIG. 5A) directly to the enable signal of the multiplier as shown in FIG. 5B and not through the tap control logic (block 570 in FIG. 5A). This enables the multiplier to compute the other (m-c) sub-elements. However, this creates a very long logic route and may limit the clock frequency at which the system might work.

Figure 7E:
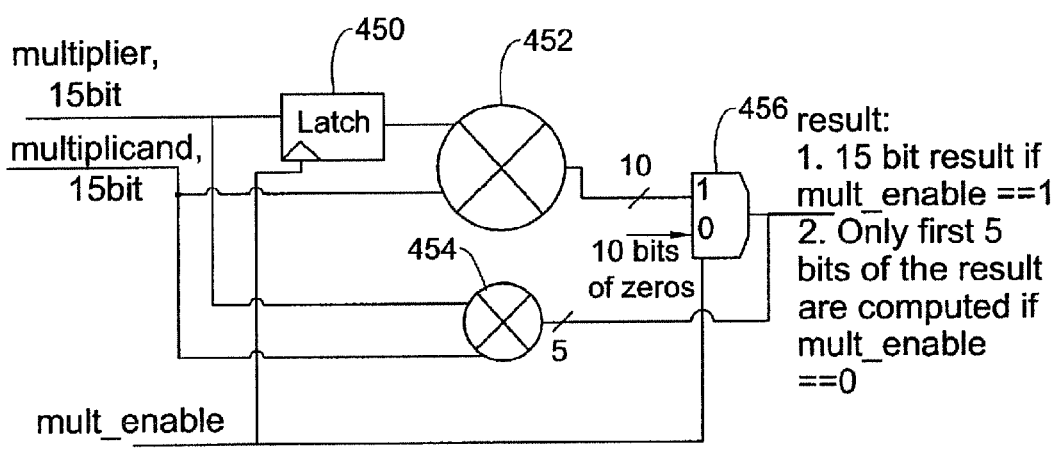

According to yet another embodiment, as shown in FIG. 7E, a latch 450 is added before the "large" multiplier 452. The latch 450 is operative to latch the data to the (m-c) sub-elements which are only rarely computed. Whenever the enable signal goes high, the latch 450 latches in the new data, enabling the computation of the m-c sub-elements for the new data. Thus, power is consumed only when the enable signal goes high rather than both when it goes high and again later when it goes back to low.

Figure 8A:
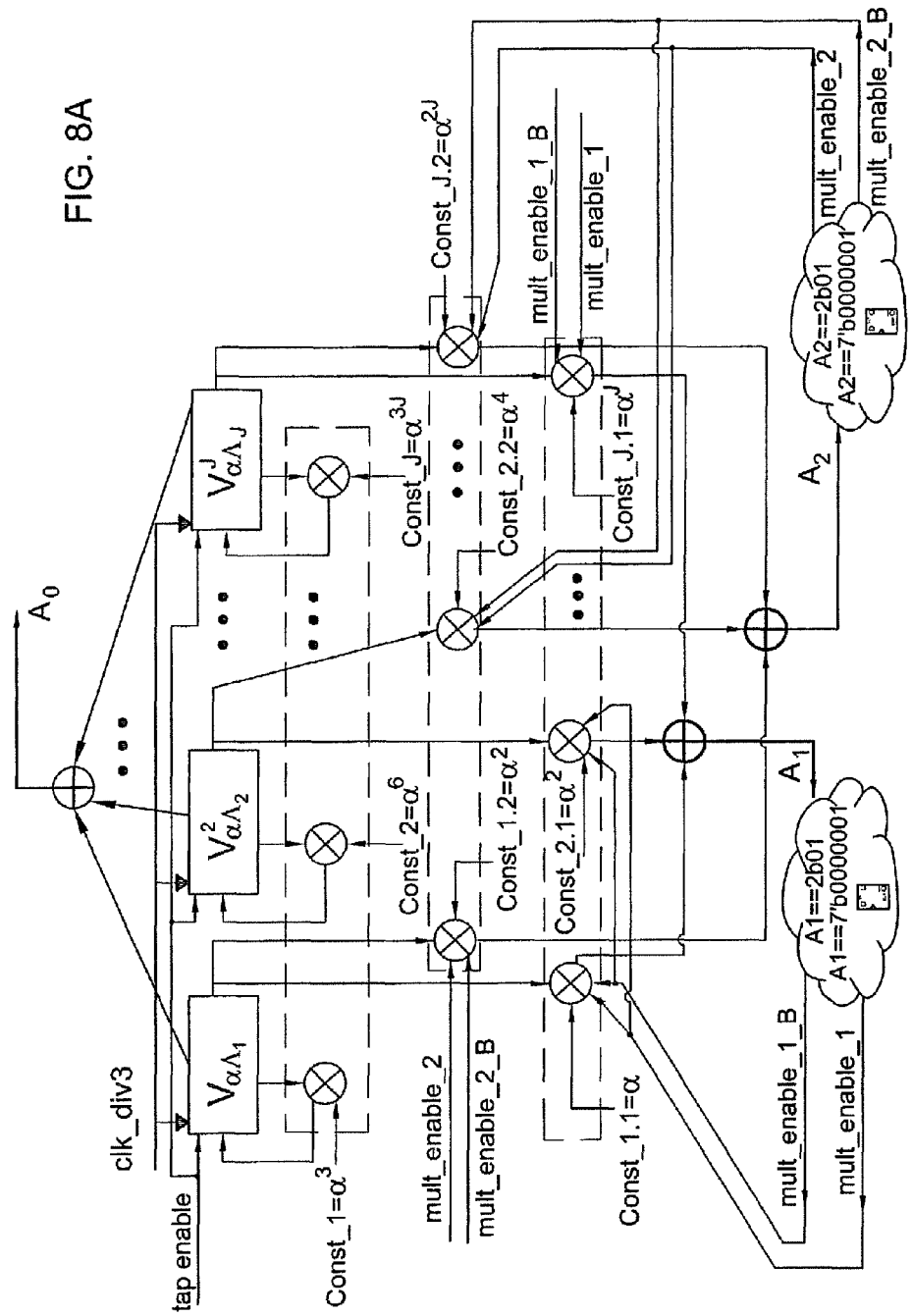
FIG. 8A is a simplified functional block diagram illustration of an "in parallel" implementation of blocks 220 and 230 of FIG. 1B, having registers whose initial contents are as shown, which effects a three-mode low power partial Chien search characterized in that searching is only sometimes performed at high precision, and at other times is performed at medium or low precision, all in accordance with certain embodiments of the present invention.

FIG. 8A is a simplified functional block diagram illustration of an "in parallel" implementation of blocks 220 and 230 of FIG. 1B, which effects a three-mode low power partial Chien search characterized in that searching is only sometimes performed at high precision, and at other times is performed at medium or low precision, all in accordance with certain embodiments of the present invention. It is appreciated that an apparatus constructed and operative in accordance with multi-precision mode embodiments of the present invention can have any suitable number of precision modes, of which 2-mode and 3-mode alternatives are specifically shown merely by way of example.

Figure 8B:
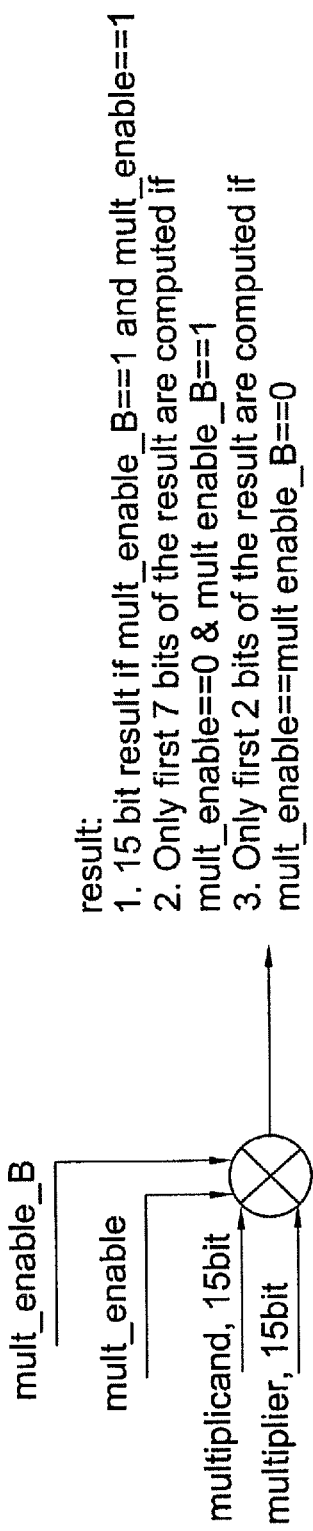
FIG. 8B is a diagram showing the inputs and outputs of an individual one of the multipliers of FIG. 8A, according to a three-precision mode embodiment of the apparatus of FIG. 8A in which multiplication is effected either at full-precision, medium-precision or minimal-precision. It is appreciated that apparatus constructed and operative in accordance with certain embodiments of the present invention can have any suitable number of precision modes, of which 2-mode and 3-mode alternatives are specifically shown.
Figure 8C:
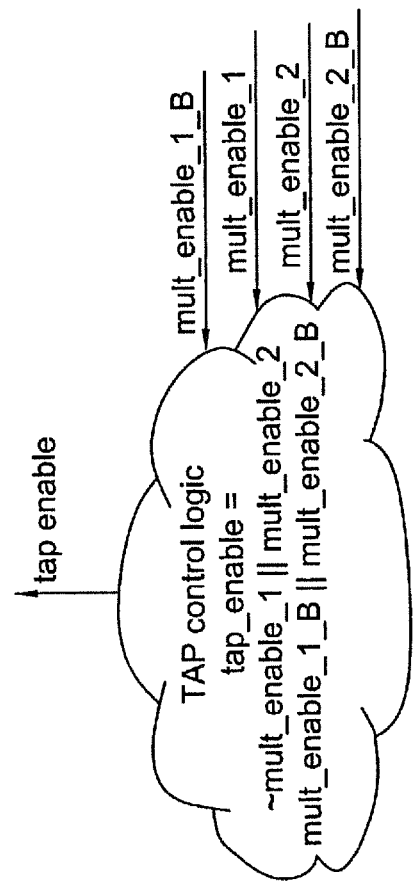
FIG. 8C is a diagram of tap control logic for the tap_enable signal of FIG. 8A according to an embodiment of the present invention.

FIG. 8B is a diagram showing the inputs and outputs of an individual one of the multipliers of FIG. 8A. As shown, multiplication is effected either at full-precision, medium-precision or minimal-precision. FIG. 8C is a diagram of tap control logic for the tap_enable signal of FIG. 8A according to an embodiment of the present invention.

Figure 9:
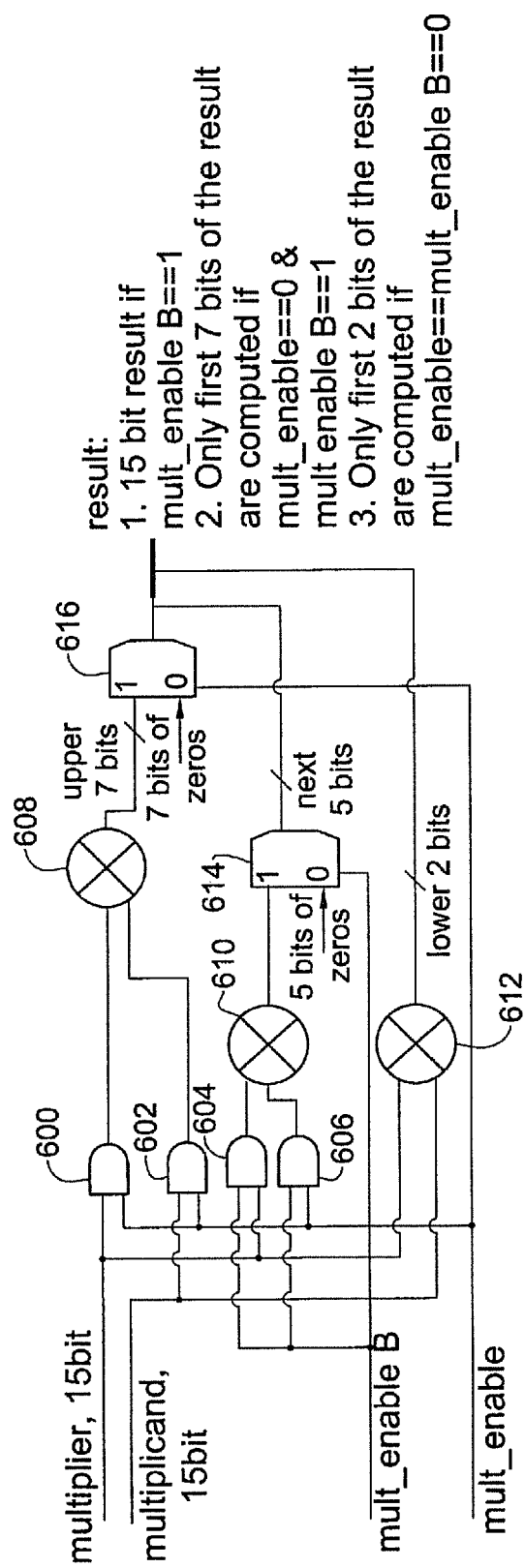
FIG. 9 is a simplified electronic diagram of one implementation of an individual one of the multipliers of FIG. 5A, constructed and operative in accordance with the three-precision mode embodiment of FIG. 8B but otherwise similar to the multiplier of FIG. 7C, it being appreciated that alternatively, any of the two-precision mode implementations of FIGS. 7A, 7B and 7D can be adapted to the three-precision mode embodiment of FIG. 12, mutatis mutandis.
Figure 12:
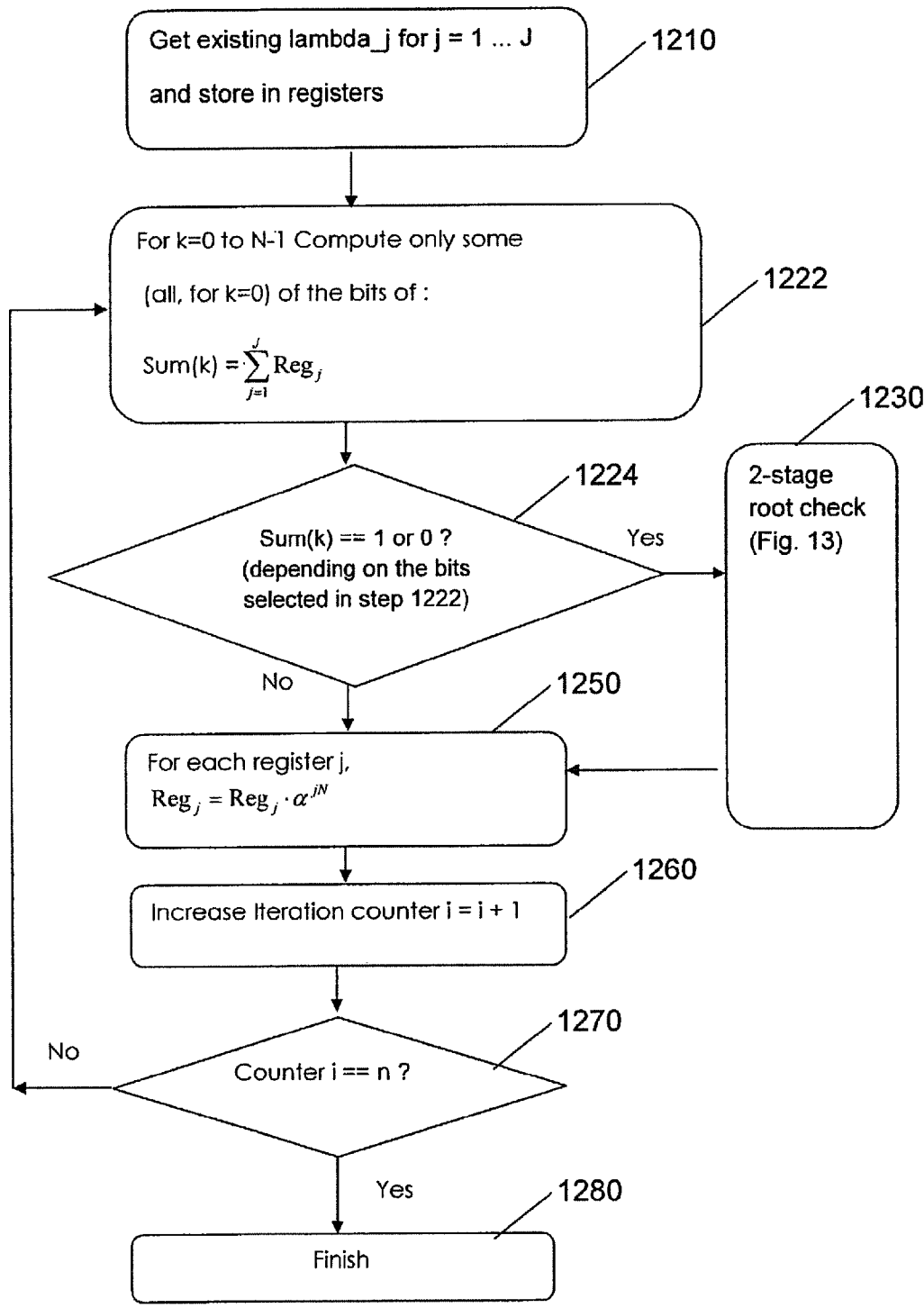
FIG. 12 is a simplified flowchart illustration of a method of operation for the apparatus of FIG. 5A, according to the three-precision mode embodiment thereof.

FIG. 9 is a simplified electronic diagram of one implementation of an individual one of the multipliers of FIG. 5A, constructed and operative in accordance with the three-precision mode embodiment of FIG. 8B but otherwise similar to the multiplier of FIG. 7C, it being appreciated that alternatively, any of the two-precision mode implementations of FIGS. 7A, 7B and 7D can be adapted to the three-precision mode embodiment of FIG. 12, mutatis mutandis. In the embodiment of FIG. 9, each multiplier has 3 precision modes rather than 2. In the illustrated embodiment, 2, 7 and 15 bits of the multiplication result are computed when the multiplier works in minimal mode, medium mode and full-mode precision respectively. The Chien search process then includes an additional Summation step as described below in detail with reference to the flow-chart of FIG. 12.

To optimally select the number of sub-elements computed at each step in FIG. 9, the following formula (Formula X), which estimates the power consumed, may be used. Preg and Pmul are defined as before and c1 and c2 are the number of sub-elements computed at the first precision and second precision levels respectively:

$$P(c_1, c_2, N) = \frac{P_{reg}}{N} + \frac{P_{mult}}{N} + \frac{(N-1)}{N} \cdot P_{mult} \cdot \frac{c_1}{m} + \frac{(N-1)}{N} \cdot P_{mult} \cdot \frac{c_2}{m} \frac{1}{q^{c_1}} + \frac{(N-1)}{N} \cdot P_{mult} \cdot \frac{1}{q^{c_2}}$$

$$= \frac{P_{reg}}{N} + \frac{P_{mult}}{N} \cdot \left(1 + (N-1) \cdot \left(\frac{c}{m} + \frac{c_2}{m} \frac{1}{q^{c_1}} + \frac{1}{q^{c_2}}\right)\right)$$

As an example, consider the case of q=2 and m=15. To minimize the power consumption $P(c_1,c_2,N)$ the following may be minimized:

$$\left(\frac{c}{m} + \frac{c_2}{m} \frac{1}{q^{c_1}} + \frac{1}{q^{c_2}}\right).$$

Enumeration over the values of $c_i$ and $c_2$ between 1 and 15 yields that computing 2 bits at the first step and 7 bits at the second step yields the lowest power consumption.

Figure 10:
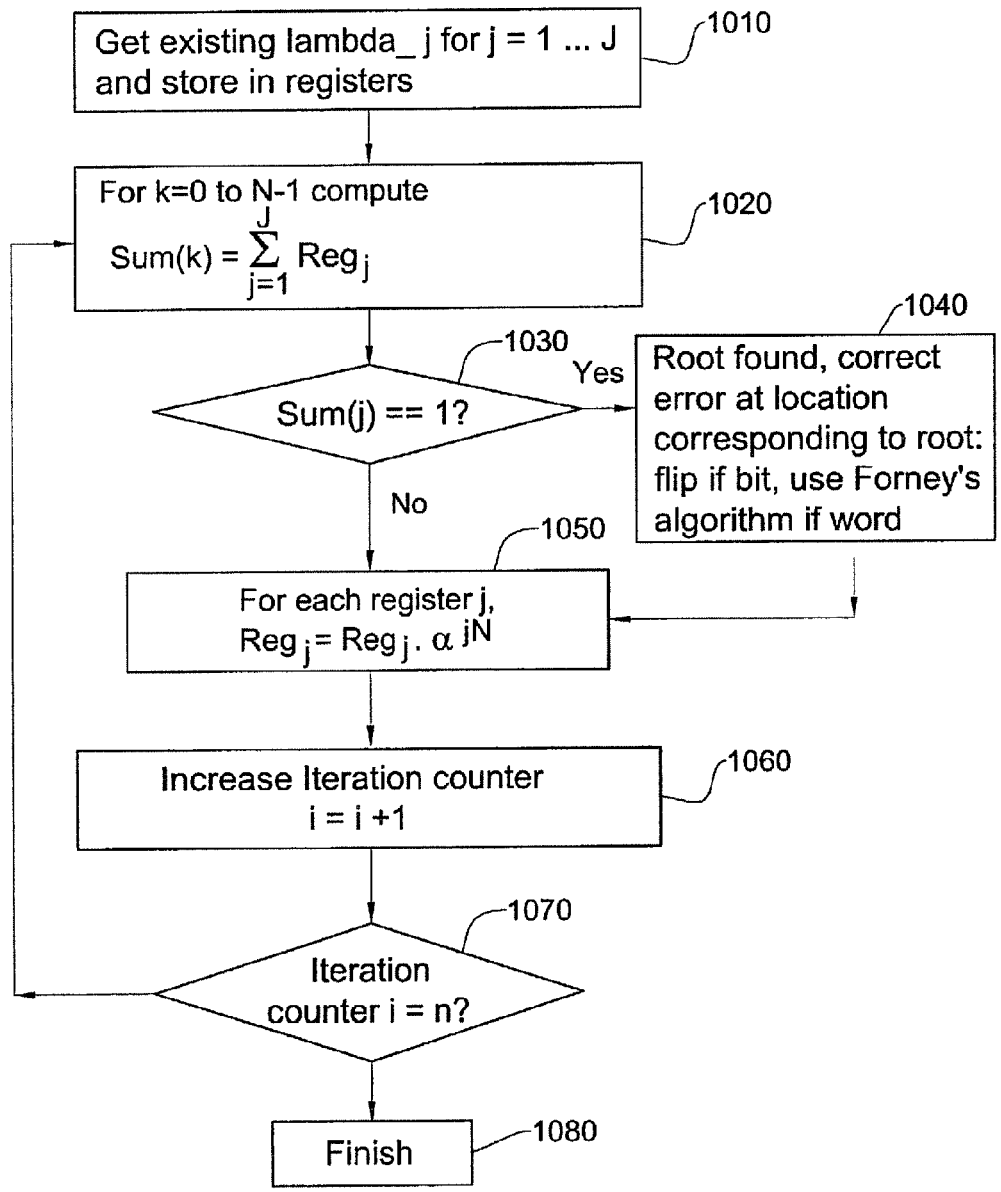
FIG. 10 is a prior art simplified flowchart illustration of a method of operation for the "in parallel" prior art apparatus of FIG. 4.
Figure 11:
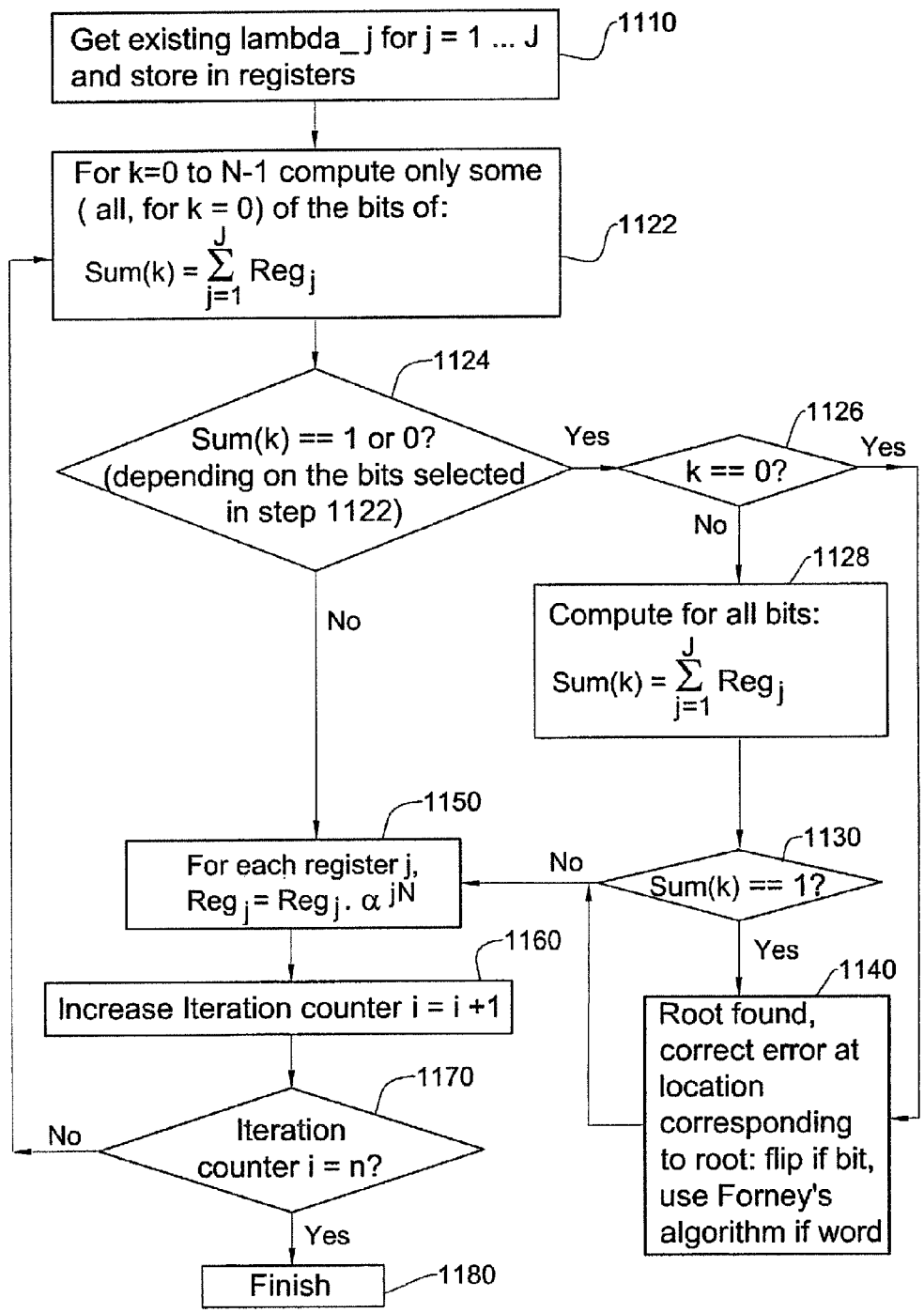
FIG. 11 is a simplified flowchart illustration of a method of operation for the apparatus of FIG. 5A, according to the two-precision mode embodiment thereof.
Figure 13:
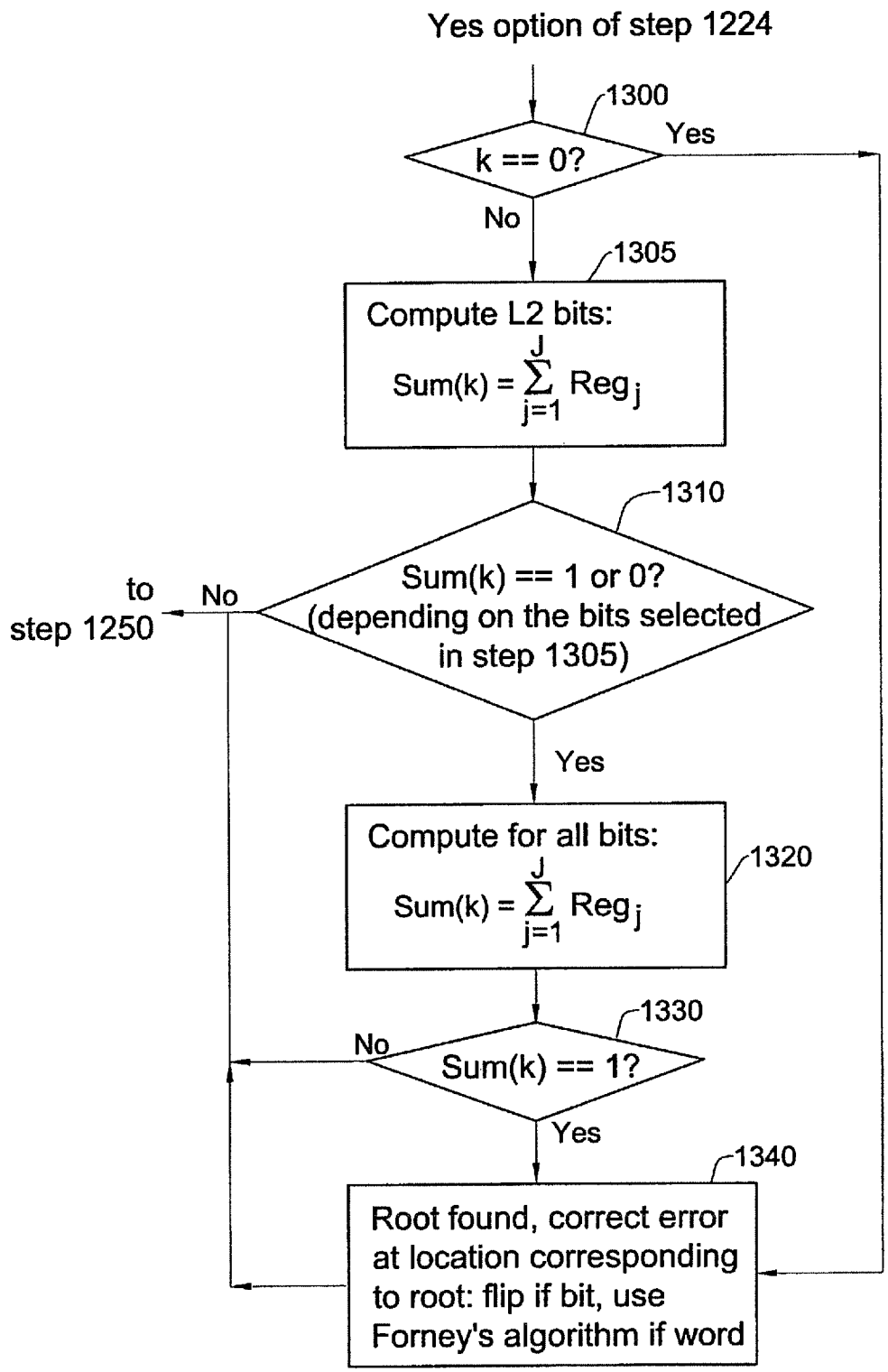
FIG. 13 is a simplified flowchart illustration of a method for performing the two-stage root check step of FIG. 12, according to certain embodiments of the present invention.

FIG. 10 is a prior art simplified flowchart illustration of a method of operation for the "in parallel" prior art apparatus of FIG. 4. FIG. 11 is a simplified flowchart illustration of a method of operation for the apparatus of FIG. 5A, operative in accordance with a two-precision mode embodiment of the present invention. FIG. 12 is a simplified flowchart illustration of a method of operation for the apparatus of FIG. 8A, operative in accordance with a three-precision mode embodiment of the present invention. FIG. 13 is a simplified flowchart illustration of a method for performing the 2-stage root check step 1230 of FIG. 12, according to certain embodiments of the present invention.

It is appreciated that in each iteration, N error locator polynomials are evaluated. Since there are n/N (due to parallelization) iterations, a total of n polynomials are evaluated per codeword.

It is appreciated that in the illustrated embodiments, the number of precision modes in the embodiment of FIGS. 8A-8C, 9, 12-13 happens to be 3, the number of bits computed in the lowest precision mode in the embodiment of FIGS. 5A-7E, 11 happens to be 3, and the number N of evaluation points in the parallelized apparatus of FIG. 3 also happens to be 3. It is appreciated that these selected values are not intended to be limiting nor need they be equal: alternatively, for example, the number of precision modes may be 4, the number of bits computed in the lowest precision mode in the embodiment of FIGS. 5A-7E, 11 may be 2, and the number N of evaluation points in the parallelized apparatus of FIG. 3 may be 5.

It is appreciated that the $GF(2^{15})$ field is used herein merely as an example and that any other field parameters may be employed, such as $GF(2^8)$ or $GF(7^5)$ or $GF(7^8)$.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Any data described as being stored at a specific location in memory may alternatively be stored elsewhere, in conjunction with an indication of the location in memory with which the data is associated. For example, instead of storing page- or erase-sector-specific information within a specific page or erase sector, the same may be stored within the flash memory device's internal microcontroller or within a microcontroller interfacing between the flash memory device and the host, and an indication may be stored of the specific page or erase sector associated with the cells.

It is appreciated that the teachings of the present invention can, for example, be implemented by suitably modifying, or interfacing externally with, flash controlling apparatus. The flash controlling apparatus controls a flash memory array and may comprise either a controller external to the flash array or a microcontroller on-board the flash array or otherwise incorporated therewithin. Examples of flash memory arrays include Samsung's K9XXG08UXM series, Hynix's HY27UK08BGFM Series, Micron's MT29F64G08TAAWP or other arrays such as but not limited to NOR or phase change memory. Examples of controllers which are external to the flash array they control include STMicroelectrocincs's ST7265x microcontroller family, STMicroelectrocincs's ST72681 microcontroller, and SMSC's USB97C242, Traspan Technologies' TS-4811, Chipsbank CBM2090/CBM1190. Examples of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and can alternatively, for example, be NOR-type or phase change memory-type.

Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an Encoder and matching decoder, and a control system managing all of the above.

The present invention may for example interface with or modify, as per any of the embodiments described herein, one, some or all of the above components and particularly with the ECC component.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order. "e.g." is used herein in the sense of a specific example which is not intended to be limiting.

The invention claimed is:

1. A low power Chien searching method employing Chien search circuitry comprising at least two hardware components that compute at least two corresponding bits comprising a Chien search output, the method comprising: activating only a subset of the hardware components thereby to compute only a subset of the bits of the Chien search output; and only if a criterion on the subset of the bits of the Chien search output is satisfied, activating hardware components other than those in said subset of hardware components, to compute additional bits of said Chien search output other than the bits in said subset of bits.

2. A method according to claim 1 wherein said activating-only-if comprises activating all hardware components outside of said subset of said plurality of hardware components, if the Chien criterion is not satisfied by said subset of bits.

3. A method according to claim 1 wherein said hardware components evaluate at least one error locator polynomial.

4. A method according to claim 3 and also comprising using the roots of the error locator polynomial to determine locations of errors in a recovered version of sequence of externally provided bits.

5. A method according to claim 4 wherein said sequence of externally provided bits comprises data provided by a host and said recovered version comprises a representation of said data stored in flash memory.

6. A method according to claim 4 wherein said data stored in flash memory comprises data encoded in accordance with a Reed-Solomon decoding algorithm.

7. A method according to claim 4 wherein said data stored in flash memory comprises data encoded in accordance with a BCH decoding algorithm.

8. A method according to claim 5 and further comprising correcting said errors to reproduce said data provided by the host.

9. A method for correcting a plurality of errors occurring at a corresponding plurality of locations within a recovered version of data provided by a host, said recovered version having been stored in memory, the method comprising: constructing a polynomial characterized in that roots thereof indicate locations of the errors in the recovered version of the data; and at least once, determining whether a value of the polynomial equals zero, wherein the value of the polynomial comprises a summation of a sequence of at least two bits, wherein at least once, said determining comprises determining whether each bit in only a subsequence of said sequence of bits equals zero; and subsequently determining whether at least some of the bits in said sequence of bits, other than in said subsequence of bits, equal zero, only if all bits in said subsequence equal zero.

10. A method according to claim 9 and further comprising correcting said errors to reproduce said data provided by the host.

11. Apparatus for finding roots of a polynomial defined over a finite field, said roots configured to represent location of errors within a recovered version of data, the apparatus comprising: polynomial root finding apparatus operatively configured to find roots of a polynomial which is a weighted sum of powers of a variable, said weighted sum being defined by a variable and by a sequence of coefficients by which said powers of said variable are respectively multiplied, the polynomial having a value given an individual sequence of coefficients and given an individual value for said variable, said polynomial root finding apparatus comprising polynomial value determination apparatus operative to determine, for at least one given individual sequence of coefficients and individual value for said variable, whether the value of the polynomial, given said individual sequence of coefficients and said individual value for said variable, equals zero, wherein the value of the polynomial comprises a sequence of at least two bits; said polynomial value determination apparatus comprising: partial polynomial value determination apparatus operative to determine whether each bit in only a subsequence of said sequence of bits equals zero; and selectively activatable complementary polynomial value determination apparatus operative to determine whether at least some of the bits in said sequence of bits other than in said subsequence equal zero, only if all bits in said subsequence equal zero.

12. Apparatus according to claim 11 wherein said partial polynomial value determination apparatus comprises a multiplier which is always active and said selectable activatable apparatus is activated only if an Error Locator Polynomial evaluation of the bits in said subsequence is equal to 1.

13. Apparatus according to claim 12 and also comprising a register upstream of the selectable activatable apparatus.

14. Apparatus according to claim 11 wherein the bits included in said subsequence of bits comprise the first, lower bits in said sequence.

15. Apparatus according to claim 11 wherein the bits included in said subsequence of bits are non-consecutive in said sequence.

16. A method according to claim 1 wherein said hardware components are operative for finding roots of a polynomial which is a weighted sum of powers of a variable, said weighted sum being defined by a variable and by a sequence of coefficients by which said powers of said variable are respectively multiplied, the polynomial having a value given an individual sequence of coefficients and given an individual value for said variable, said value comprising said Chien search output, said finding including determining, for at least one given individual sequence of coefficients and individual value for said variable, whether the value of the polynomial, given said individual sequence of coefficients and said individual value for said variable, equals zero, wherein the value of the polynomial comprises a sequence of at least two bits.

17. A method according to claim 16 wherein said criterion is whether each of the bits in said subset of bits equals zero.

18. A method according to claim 9 wherein said subsequently determining comprises determining whether all of the bits in said sequence of bits, other than in said subsequence of bits, equal zero, only if all bits in said subsequence equal zero.

19. A method according to claim 9 wherein said subsequently determining comprises: determining whether only some of the bits in said sequence of bits, other than in said subsequence of bits, equal zero, only if all bits in said subsequence equal zero; and subsequently determining whether at least some of the bits in said sequence of bits, other than said some bits and said bits in said subsequence of bits, equal zero, only if all of said some bits equal zero and all of said bits in said subsequence equal zero.

20. A low power Chien searching system employing Chien search circuitry comprising at least two hardware components that compute at least two corresponding bits comprising a Chien search output, the system comprising: subset activation apparatus operative to activate only a subset of the hardware components thereby to compute only a subset of the bits of the Chien search output; and polynomial evaluation completion activation apparatus operative, only if a criterion on the subset of the bits of the Chien search output is satisfied, to activate hardware components other than those in said subset of hardware components, to compute additional bits of said Chien search output other than the bits in said subset of bits.

21. A method according to claim 1 wherein said subset of bits comprises a number of bits which minimizes the power used by said hardware components to perform said activating step and said only-if-activating step.

22. A method for saving power consumed by hardware components, said hardware components operatively configured to perform a Chien search, said method comprising: providing said hardware components; and initiating said Chien search utilizing only a selective subset of the hardware components whereby power consumption is lower compared with power consumed in a Chien search utilizing all of said hardware components.

23. A method according to claim 22 wherein said Chien search is utilized to determine locations of errors in a recovered version of sequence of externally provided bits.

24. A method according to claim 23 wherein said sequence of externally provided bits comprises data provided by a host and said recovered version comprises a representation of said data stored in flash memory.

25. An error correction decoder comprising: an error locator polynomial generator operative to generate at least one error locator polynomial; and an error locator polynomial evaluator operative to rule out at least one root of the error locator polynomial based on only a partial evaluation thereof.

* * * * *